US012656959B2

(12) United States Patent
Chen et al.

(10) Patent No.: US 12,656,959 B2
(45) Date of Patent: Jun. 16, 2026

(54) CROSS TEMPERATURE NAND READ

(71) Applicant: Sandisk Technologies, Inc., Milpitas, CA (US)

(72) Inventors: Albert Bor Kai Chen, Milpitas, CA (US); Jiahui Yuan, Fremont, CA (US); Sarath Puthenthermadam, San Jose, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 126 days.

(21) Appl. No.: 18/670,485

(22) Filed: May 21, 2024

(65) Prior Publication Data

US 2025/0362811 A1    Nov. 27, 2025

(51) Int. Cl.
*G11C 16/26* (2006.01)
*G06F 3/06* (2006.01)
*G11C 16/04* (2006.01)
*G11C 16/10* (2006.01)

(52) U.S. Cl.
CPC .......... *G06F 3/0619* (2013.01); *G06F 3/0653* (2013.01); *G06F 3/0679* (2013.01); *G11C 16/0483* (2013.01); *G11C 16/10* (2013.01); *G11C 16/26* (2013.01)

(58) Field of Classification Search
CPC .... G06F 3/0619; G06F 3/0653; G06F 3/0679; G11C 16/0483; G11C 16/10; G11C 16/26
See application file for complete search history.

(56) References Cited

U.S. PATENT DOCUMENTS

| | | | |
|---|---|---|---|
| 8,576,624 B2 | 11/2013 | Dutta et al. | |
| 9,472,298 B1 | 10/2016 | Louie et al. | |
| 9,710,325 B2 | 7/2017 | Chen et al. | |
| 10,475,523 B2 | 11/2019 | Sharon et al. | |
| 11,194,523 B2 | 12/2021 | Achtenberg et al. | |
| 2018/0090218 A1 | 3/2018 | Takada et al. | |
| 2020/0363969 A1 | 11/2020 | Shen et al. | |
| 2022/0180949 A1* | 6/2022 | Lee ................... | G11C 16/3427 |
| 2022/0406383 A1* | 12/2022 | Chin ..................... | G11C 16/10 |
| 2023/0393936 A1 | 12/2023 | Xotta et al. | |
| 2024/0427500 A1* | 12/2024 | Ciocchini ............. | G06F 3/0679 |
| 2025/0378896 A1* | 12/2025 | Rayaprolu .......... | G11C 11/5642 |

* cited by examiner

*Primary Examiner* — Jerome Leboeuf
(74) *Attorney, Agent, or Firm* — Pearl Cohen Zedek Latzer Baratz LLP

(57) ABSTRACT

Technology for dynamically updating read references levels in NAND memory. A memory system compensates for both cross-temperature (TempX) effects and data retention (DR) effects. The Vt of a NAND memory cell transistor may depend on the temperature, which leads to the TempX effect. The DR effect is due to a change in charge in the memory cell between programming and sensing. The memory system senses a group of memory cells at two Vt distributions to determine a shift in each Vt distribution. One of the Vt distribution may exhibit a greater shift due to the TempX effect than the DR effect. The other Vt distribution may exhibit a greater shift due to the DR effect than the TempX effect. The memory system determines one or more read level offsets based on both the first shift and the second shift.

15 Claims, 24 Drawing Sheets

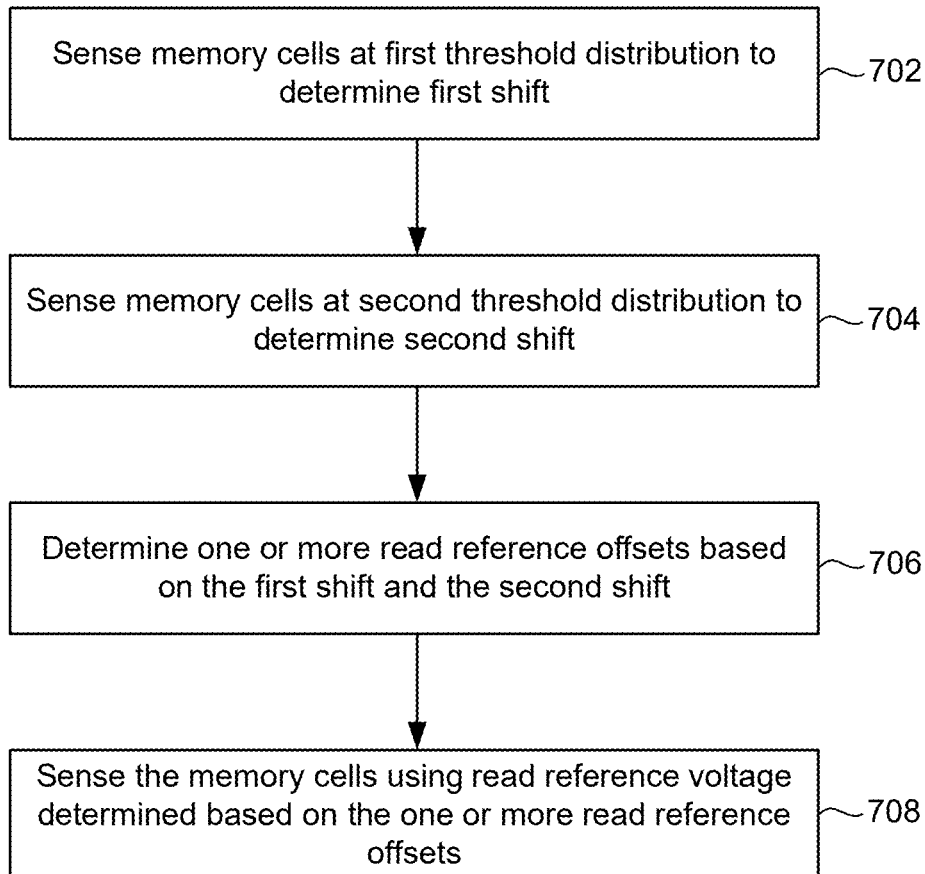

Sense memory cells at first threshold distribution to determine first shift — 702

Sense memory cells at second threshold distribution to determine second shift — 704

Determine one or more read reference offsets based on the first shift and the second shift — 706

Sense the memory cells using read reference voltage determined based on the one or more read reference offsets — 708

S_y
Read
Level
Shift

906

912

910

908

904

S_y Bit Scan Count

902

S_x Bit Scan Count

918

S_x
Read
Level
Shift

<u>1000</u>

Perform first bitscan count at first Vt threshold distribution     ~1002

Perform second bitscan count at second Vt threshold distribution     ~1004

Select table based on the first bitscan count     ~1006

Select read level offset from selected table based on second bitscan count     ~1008

| TempX Factor | Table |
|---|---|
| Bit Count in Range 1 | Table 1 |
| Bit Count in Range 2 | Table 2 |
| Bit Count in Range 3 | Table 3 |

| TempX parameter | DR Zone 1 | DR Zone 2 | DR Zone 3 | DR Zone 4 |
|---|---|---|---|---|
| DVCG_S1R | 4 | 4 | 4 | 4 |
| DVCG_S2S3R | 6 | 6 | 6 | 8 |
| DVCG_S4S5R | 4 | 4 | 4 | 4 |
| DVCG_S6S7R | 4 | 4 | 4 | 4 |
| DVCG_S8S9R | 2 | 2 | 2 | 0 |
| DVCG_S10S11R | 0 | 0 | 0 | -2 |
| DVCG_S12S13R | -2 | -4 | -6 | -8 |
| DVCG_S14R | -4 | -6 | -6 | -14 |
| DVCG_S15R | -6 | -6 | -12 | -16 |

S_y
Bit Scan
Count

S_x Bit Scan Count

1250 —

| TempX Zone | S1 | S2S3 | S4S5 | S6S7 | S8S9 | S10S11 | S12S13 | S14 | S14 |
|---|---|---|---|---|---|---|---|---|---|
| TempX Zone 1 | 0 | 0 | 0 | 0 | 0 | 0 | 0 | 0 | 0 |
| TempX Zone 2 | +4 | +5 | +4 | +4 | +4 | +3 | +2 | +1 | +1 |
| TempX Zone 3 | +8 | +10 | +9 | +8 | +7 | +6 | +5 | +3 | +2 |

1300

| Perform first bitscan count at first Vt threshold distribution |~1302

Perform second bitscan count at second Vt threshold distribution |~1304

Determine TempX zone based on both bitscan counts |~1306

Select TempX read offset from table based on TempX zone |~1308

Apply TempX read offset to DR read offset for final read offset |~1310

S_x bitscan count

S_y read level shift

| TempX parameter | -60 C | | | | -30 C | | | | 30 C | | | | 60 C | | | |
|---|---|---|---|---|---|---|---|---|---|---|---|---|---|---|---|---|
| | Bit | Step | Start | End | Bit | Step | Start | End | Bit | Step | Start | End | Bit | Step | Start | End |
| DVCG_S1R | 2 | 2 | -16 | -10 | 2 | 2 | -8 | -2 | 2 | 2 | 0 | 6 | 2 | 2 | 6 | 12 |
| DVCG_S2S3R | 2 | 2 | -16 | -10 | 2 | 2 | -8 | -2 | 2 | 2 | 0 | 6 | 2 | 2 | 6 | 12 |
| DVCG_S4S5R | 2 | 2 | -12 | -6 | 2 | 2 | -8 | -2 | 2 | 2 | 0 | 6 | 2 | 2 | 6 | 12 |
| DVCG_S6S7R | 2 | 2 | -12 | -6 | 2 | 2 | -6 | 0 | 2 | 2 | 0 | 6 | 2 | 2 | 6 | 12 |
| DVCG_S8S9R | 2 | 2 | -10 | -4 | 2 | 2 | -6 | 0 | 2 | 2 | 0 | 6 | 2 | 2 | 4 | 10 |
| DVCG_S10S11R | 2 | 2 | -8 | -2 | 2 | 2 | -6 | 0 | 2 | 2 | 0 | 6 | 2 | 2 | 4 | 10 |
| DVCG_S12S13R | 2 | 2 | -6 | 0 | 2 | 2 | -6 | 0 | 2 | 2 | -2 | 4 | 2 | 2 | 4 | 10 |
| DVCG_S14R | 2 | 2 | -6 | 0 | 2 | 2 | -4 | 2 | 2 | 2 | -2 | 4 | 2 | 2 | 2 | 8 |
| DVCG_S15R | 2 | 2 | -4 | 2 | 2 | 2 | -4 | 2 | 2 | 2 | -2 | 6 | 2 | 2 | 2 | 8 |

1600

Perform first bitscan count at first Vt threshold distribution ~1602

Perform second bitscan count at second Vt threshold distribution ~1604

Determine TempX zone based on first bitscan count ~1606

Determine read offset from table based on TempX zone and second bitscan count (using step) ~1608

Apply read offset to DR read offset for final read offset ~1610

CROSS TEMPERATURE NAND READ

BACKGROUND

The present disclosure relates to technology for non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery).

A memory structure in the memory system typically contains many memory cells and various control lines. Herein, a memory system that uses non-volatile memory for storage may be referred to as a storage system. The memory structure may be three-dimensional (3D). One type of 3D structure has non-volatile memory cells arranged as vertical NAND strings. The 3D memory structure may be arranged into units that are commonly referred to as blocks. For example, a block in a NAND memory system contains many NAND strings. A NAND string contains memory cell transistors connected in series, a drain side select gate at one end, and a source side select gate at the other end. Each NAND string is associated with a bit line. The block typically has many word lines that provide voltages to the control gates of the memory cell transistors. In some architectures, each word line connects to the control gate of one memory cell on each respective NAND string in the physical block.

One type of three-dimensional memory structure has alternating dielectric layers and conductive layers in a stack. NAND strings are formed vertically in the alternating dielectric layers and conductive layers in what may be referred to as memory holes. For example, after memory holes are drilled into the stack of alternating dielectric layers and conductive layers, the memory holes are filled in with layers of materials to create a vertical column of memory cells (e.g., NAND string). These layers may include one or more layers for a tunnel dielectric, a charge-trapping material, and a channel (or body).

For memory such as NAND, a large set of memory cells are erased prior to programming. After erasing, the memory cells are programmed one unit at a time. In some techniques, the memory cells are programmed one word line at a time. The non-volatile memory cells may be programmed to store data. Typically, the memory cells are programmed to a number of data states. Using two data states to store a single bit per cell is referred to herein as SLC programming. Using a greater number of data states allows for more bits to be stored per memory cell. Using additional data states to store two or more bits per cell is referred to herein as MLC programming. For example, four data states may be used to store two bits per memory cell, eight data states may be used in order to store three bits per memory cell, 16 data states may be used to store four bits per memory cell, etc. Some memory cells may be programmed to a data state by storing charge in the memory cell. For example, the threshold voltage (Vt) of a NAND memory cell can be set to a target Vt by programming charge into a charge storage region such as a charge trapping layer. The amount of charge stored in the charge trapping layer establishes the Vt of the memory cell. Each data state may be associated with a unique Vt distribution.

Once the memory cells in the memory device have been programmed, data may be read from the memory cells by sensing the programmed states of the memory cells. In one technique, the memory cells are sensed at one or more "read reference voltages." A read reference voltage is used to distinguish between two of the states. However, sensed states can sometimes vary from the written states due to one or more factors. Error detection and correction decoding can be used to detect and correct data errors resulting from sensed states that do not match written states. However, there is a limit as to how many bits in the un-decoded data read from the memory cells can be in error in order for the ECC algorithm to successfully correct all errors. Therefore, memory systems typically do not rely only on ECC algorithms. Another option is to move the read reference voltages and re-read the memory cells. In some cases, moving the read reference voltages can result in fewer bits in errors in the data prior to decoding to thereby improve the effectiveness ECC algorithm.

However, challenges remain in determining suitable read reference levels for reading a group of memory cells such that there will be a low number of bits in error in the un-decoded data.

BRIEF DESCRIPTION OF THE DRAWINGS

Like-numbered elements refer to common components in the different figures.

FIG. 7 is a flowchart of one embodiment of a process of dynamically updating read levels to compensate for both data retention and TempX.

FIG. 11A is table that links a TempX factor to a table of read level offsets.

FIG. 11B shows an example of the table of read level offsets that may be selected using the table in FIG. 11A.

FIG. 14 shows S_x bitscan count versus S_y read level shift.

FIG. 15 is a table that may be used in combination with the technique described with respect to FIG. 14.

DETAILED DESCRIPTION

Technology is disclosed for dynamically updating read references levels in NAND memory. An embodiment of a memory system compensates for both cross-temperature effects and data retention effects when dynamically updating read references levels in NAND memory. The Vt of a NAND memory cell transistor may depend on the temperature, which leads to the cross-temperature ("TempX") effect. For example, if memory cells are programmed at a one temperature and sensed at a different temperature, this temperature difference impacts the Vt. The data retention effect is due to a change in charge in the memory cell between programming and sensing. This change in charge results in a change in Vt of the memory cell. In an embodiment, the memory system senses a group of memory cells at two Vt distributions to, for example, determine a shift in each Vt distribution. One of the Vt distribution may exhibit a greater shift due to the TempX effect than the data retention effect. The other Vt distribution may exhibit a greater shift due to the data retention (DR) effect than the TempX effect. The memory system determines one or more read level offsets based on both the first shift and the second shift. As one example, the memory system determines a first read level offset based on the first shift of the first Vt distribution and a second read level offset based on the second shift of the second Vt distribution. The memory system senses the group of memory cells based on the one or more read level offsets. For example, the memory system applies the one or more read level offsets to a default read voltage for a particular state to be sensed.

Note that dynamically updating read voltages based only on the DR effect may work well if there is no TempX effect. That is, if the memory cells are sensed at the same temperature as they were programmed, dynamically updating read voltages based only on the DR effect may work well. However, if there is a TempX effect then dynamically updating read voltages based only on the DR effect may actually perform worse than not dynamically updating read voltages based only on the DR effect. In other words, the bit error rate (BER) could actually increase if the read voltages are updated to account for only the DR effect but not for the TempX effect.

Figure 1:
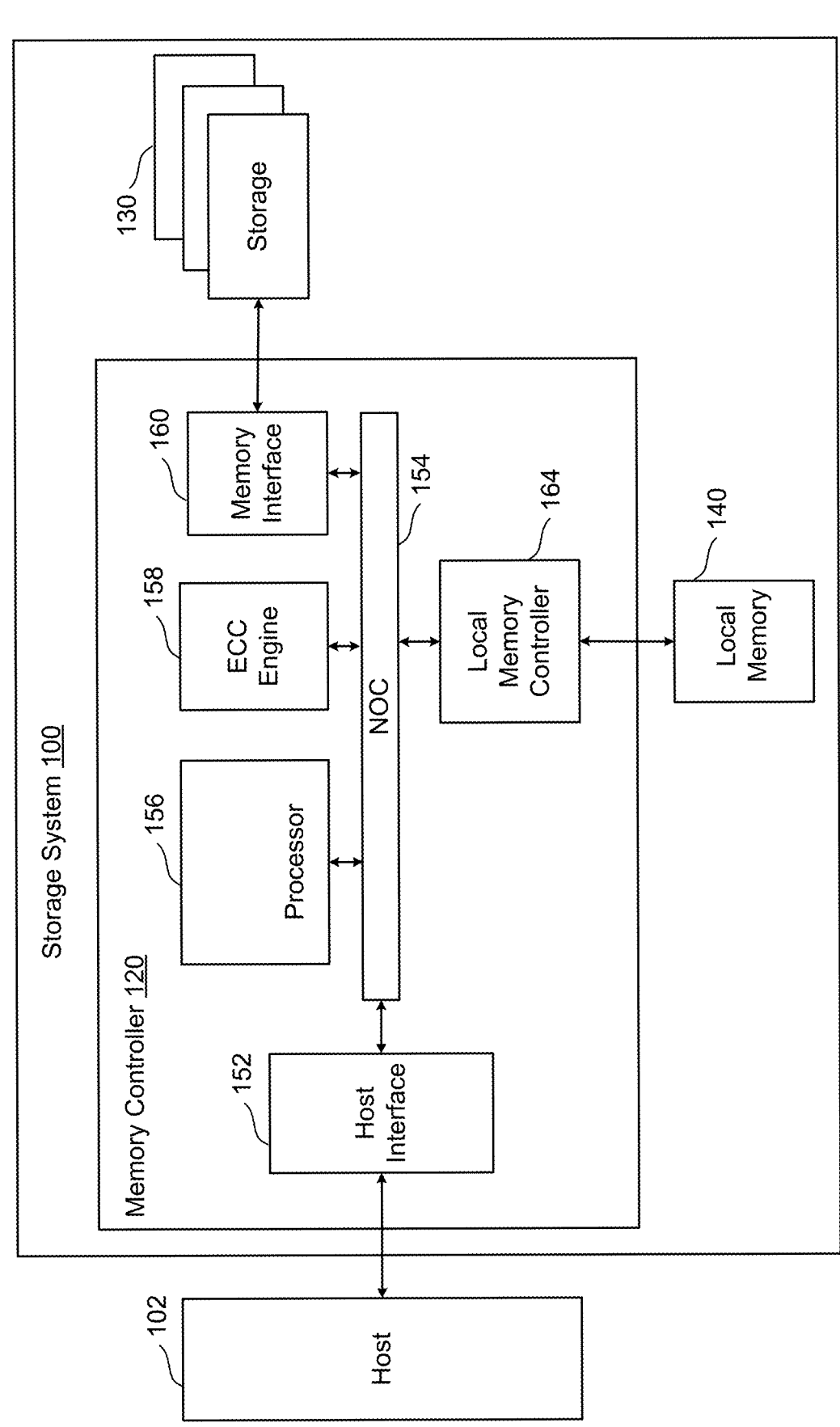
FIG. 1 is a block diagram depicting one embodiment of a memory system.

FIG. 1 is a block diagram of one embodiment of a memory system 100 that implements the technology described herein. In one embodiment, memory system 100 is a solid state drive ("SSD"). Memory system 100 can also be a memory card, USB drive or other type of memory system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a memory controller 120 (or storage controller) connected to non-volatile storage 130 and local high speed memory 140 (e.g., DRAM, SRAM, MRAM). Local memory 140 is non-transitory memory, which may include volatile memory or non-volatile memory. Local high speed memory 140 is used by memory controller 120 to perform certain operations. For example, local high speed memory 140 may store logical to physical address translation tables ("L2P tables").

Memory controller 120 comprises a host interface 152 that is connected to and in communication with host 102. In one embodiment, host interface 152 implements an NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and local memory controller 164. Local memory controller 164 is used to operate and communicate with local high speed memory 140 (e.g., DRAM, SRAM, MRAM).

ECC engine 158 performs error correction services. For example, ECC engine 158 performs data encoding and decoding. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations such as programming, erasing, reading, and memory management processes. In one embodiment, processor 156 is programmed by firmware. In other embodiments, processor 156 is a custom and dedicated hardware circuit without any software. Processor 156 may also implement a translation module, as a software/firmware process or as a dedicated hardware circuit. In many systems, the non-volatile memory is addressed internally to the memory system using physical addresses associated with the one or more memory die. However, the host system will use logical addresses to address the various memory locations. This enables the host to assign data to consecutive logical addresses, while the memory system is free to store the data as it wishes among the locations of the one or more memory die. To implement this system, memory controller 120 (e.g., the translation module) performs address translation between the logical addresses used by the host and the physical addresses used by the memory die. One example implementation is to maintain tables (i.e., the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a memory system is so large that the local memory 140 cannot hold all of the L2P tables. In such a case, the entire set of L2P tables are stored in a storage 130 and a subset of the L2P tables are cached (L2P cache) in the local high speed memory 140.

Memory interface 160 communicates with non-volatile storage 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
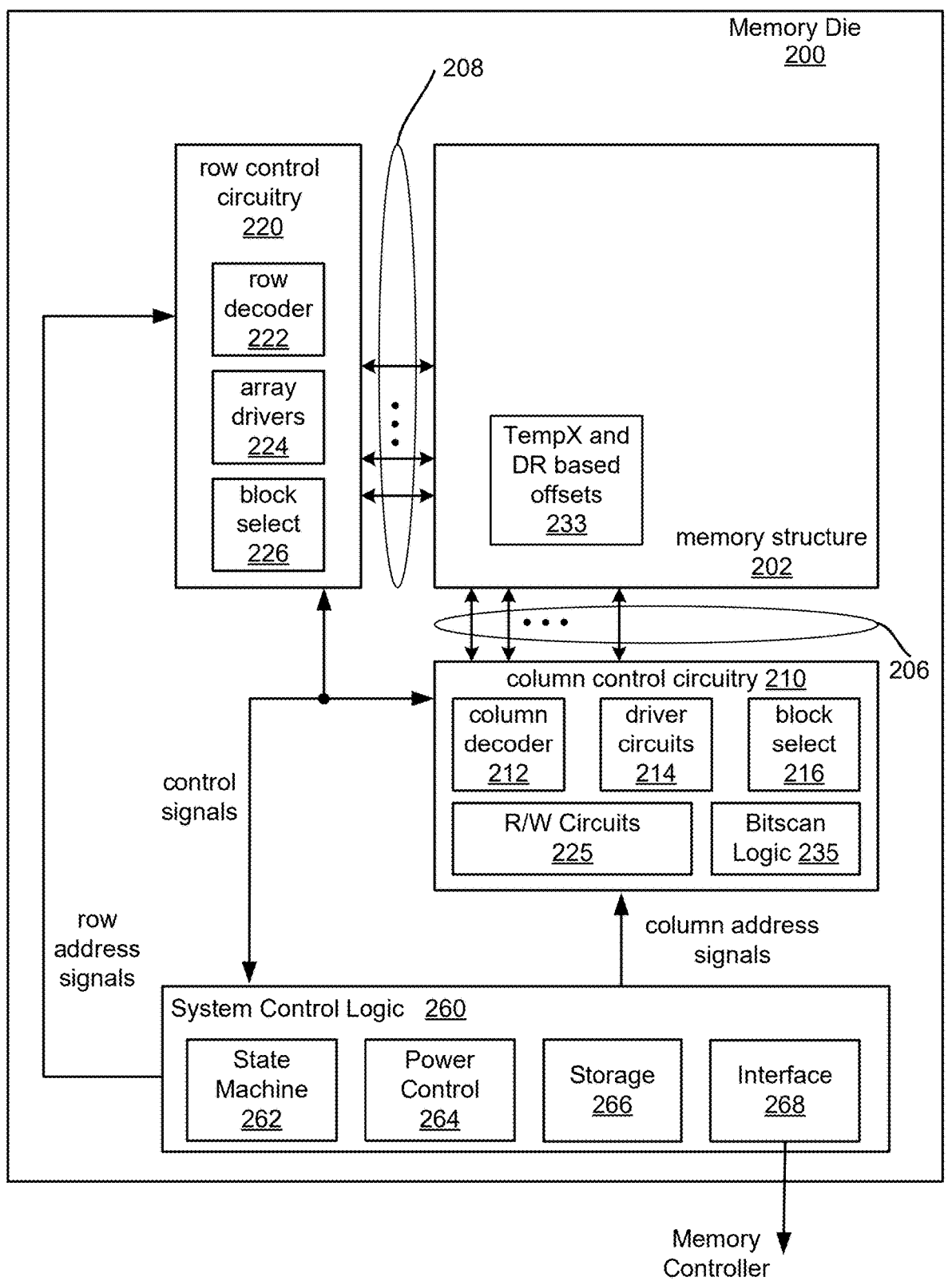
FIG. 2A is a block diagram of one embodiment of a memory die.

In one embodiment, non-volatile storage 130 comprises one or more memory dies. FIG. 2A is a functional block diagram of one embodiment of a memory die 200 that comprises non-volatile storage 130. Each of the one or more memory dies of non-volatile storage 130 can be implemented as memory die 200 of FIG. 2A. The components depicted in FIG. 2A are electrical circuits. Memory die 200 includes a memory structure 202 (e.g., memory array) that can comprise non-volatile memory cells (also referred to as non-volatile storage cells), as described in more detail below.

The array terminal lines of memory structure 202 include the various layer(s) of word lines organized as rows, and the various layer(s) of bit lines organized as columns. However, other orientations can also be implemented. Memory die 200 includes row control circuitry 220, whose outputs are connected to respective word lines of the memory structure 202. Row control circuitry 220 receives a group of M row address signals and one or more various control signals from System Control Logic circuit 260, and typically may include such circuits as row decoders 222, array drivers 224, and block select circuitry 226 for both reading and writing (programming) operations. Row control circuitry 220 may also include read/write circuitry. Memory die 200 also includes column control circuitry 210 including read/write circuits 225. The read/write circuits 225 may contain sense amplifiers and data latches. The sense amplifier(s) input/outputs are connected to respective bit lines of the memory structure 202. Although only single block is shown for structure 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers. The system control logic 260, column control circuitry 210, and/or row control circuitry 220 are configured to control memory operations such as open block reads at the die level.

System control logic 260 receives data and commands from memory controller 120 and provides output data and status to the host. In some embodiments, the system control logic 260 (which comprises one or more electrical circuits) includes state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 260 can also include a power control module 264 that controls the power and voltages supplied to the rows and columns of the memory structure 202 during memory operations. System control logic 260 includes storage 266 (e.g., RAM, registers, latches, etc.), which may be used to store parameters for operating the memory structure 202.

The memory structure 202 may store TempX and DR (Data Retention) based offsets 233. The TempX and DR (Data Retention) based offsets 233 may be used to dynamically update read reference voltages to compensate for both TempX effects and DR effects. In an embodiment, the bitscan logic 235 is used to determine a shift in a Vt distribution. The shift in a Vt distribution may be determined based on a count of memory cells having a Vt within a Vt range associated with a Vt distribution. A shift in Vt of a particular Vt distribution may be used to determine a TempX factor that is a measure of the shift due to the TempX effect. A shift in Vt of a particular Vt distribution may be used to determine a DR factor that is a measure of the shift due to the DR effect. Note that having bitscan logic 235 on the memory chip alleviates the need to transfer the data to the memory controller 120 to determine the dynamic updates to the read levels. However, optionally the memory controller 120 may take part in the dynamic updates to the read levels.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die than the die that contains the memory structure 202.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all of the other components depicted in FIG. 2A. An important characteristic of a memory circuit is its capacity, which can be increased by increasing the area of the memory die of memory system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the memory system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies. Three-dimensional NAND structures (see, for example, FIG. 4) in particular may benefit from specialized processing operations.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more dies, such as two memory dies and one control die, for example.

Figure 2B:
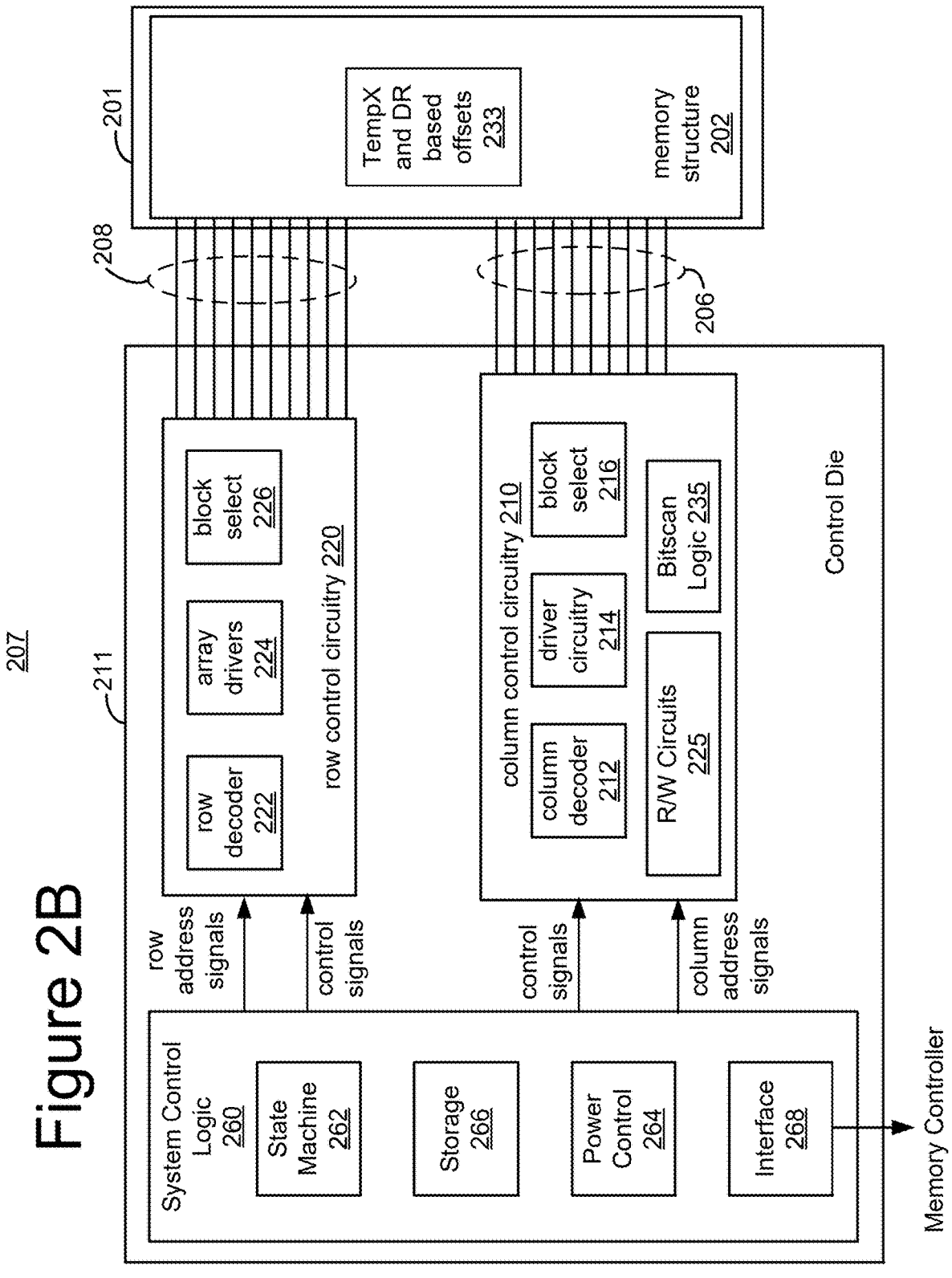
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile storage 130 of memory system 100. The integrated memory assembly 207 includes two types of semiconductor dies (or more succinctly, "die"). Memory structure die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory structure die 201. In some embodiments, the memory structure die 201 and the control die 211 are bonded together.

FIG. 2B shows an example of the peripheral circuitry, including control circuits, formed in a peripheral circuit or control die 211 coupled to memory structure 202 formed in memory structure die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory structure die 201. In some embodiments, some of the circuitry in the system control logic 260 is located on the on the memory structure die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory structure die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including read/write circuits 225 on the control die 211 coupled to memory structure 202 on the memory structure die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory structure die 201, which are connected to bit lines of memory structure 202. Each bit line of memory structure 202 may have a corresponding electrical path in electrical paths 206, including a pair of bond pads, which connects to column control circuitry 210. Similarly, row control circuitry 220, including row decoder 222, array drivers 224, and block select 226 are coupled to memory structure 202 through electrical paths 208. Each electrical path 208 may correspond to a word line, dummy word line, or select gate line. Additional electrical paths may also be provided between control die 211 and memory structure die 201.

For purposes of this document, the phrases "a control circuit" or "one or more control circuits" can include any one of or any combination of memory controller 120, all or a portion of system control logic 260, all or a portion of row control circuitry 220, all or a portion of column control circuitry 210, read/write circuits 225, sense amps, a microcontroller, a microprocessor, and/or other similar functioned circuits. A control circuit can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term "apparatus" can include, but is not limited to, one or more of, memory system 100, storage 130, memory die 200, integrated memory assembly 207, and/or control die 211.

Figures 3A, 3B:
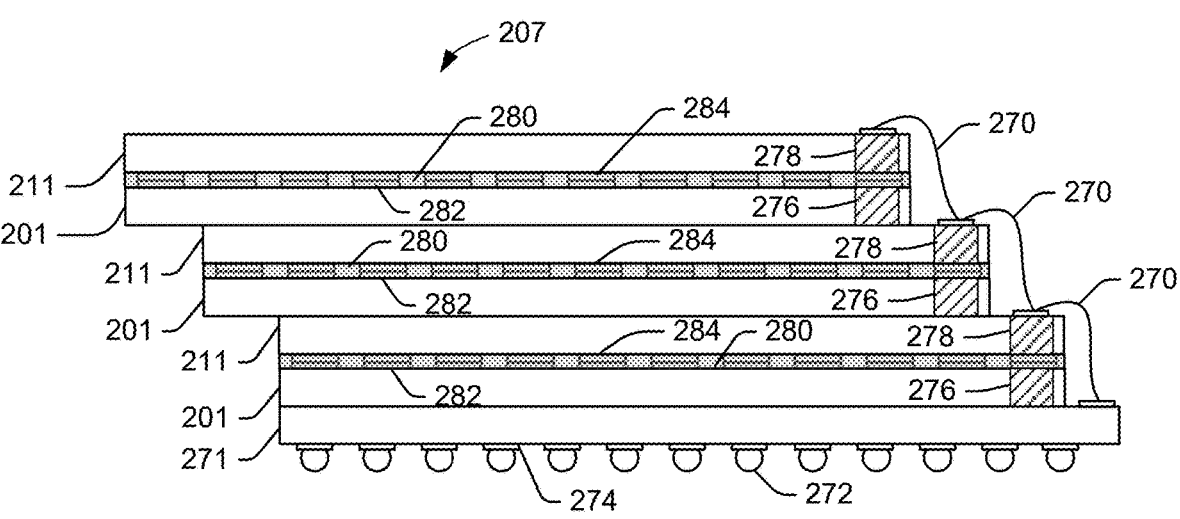
FIGS. 3A and 3B depict different embodiments of integrated memory assemblies.

In some embodiments, there is more than one control die 211 and more than one memory structure die 201 in an integrated memory assembly 207. In some embodiments, the integrated memory assembly 207 includes a stack of multiple control dies 211 and multiple memory structure dies 201. FIG. 3A depicts a side view of an embodiment of an integrated memory assembly 207 stacked on a substrate 271 (e.g., a stack comprising control die 211 and memory structure die). The integrated memory assembly 207 has three control dies 211 and three memory structure dies 201. In some embodiments, there are more than three memory structure dies 201 and more than three control dies 211. In FIG. 3A there are an equal number of memory structure dies 201 and control dies 211; however, in one embodiment, there are more memory structure dies 201 than control dies 211. For example, one control die 211 could control multiple memory structure dies 201.

Each control die 211 is affixed (e.g., bonded) to at least one of the memory structure die 201. Some of the bond pads 282/284 are depicted. There may be many more bond pads. A space between two die 201, 211 that are bonded together is filled with a solid layer 280, which may be formed from epoxy or other resin or polymer. This solid layer 280 protects the electrical connections between the die 201, 211, and further secures the die together. Various materials may be used as solid layer 280.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory structure die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

FIG. 3B depicts a side view of another embodiment of an integrated memory assembly 207 stacked on a substrate 271. The integrated memory assembly 207 of FIG. 3B has three control dies 211 and three memory structure dies 201. In some embodiments, there are many more than three memory structure dies 201 and many more than three control dies 211. In this example, each control die 211 is bonded to at least one memory structure die 201. Optionally, a control die 211 may be bonded to two or more memory structure dies 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory structure die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory structure die 201 may be bonded together. Bond pads on each die 201, 211 may be used to bond the two die together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 μm square and spaced from each other with a pitch of 5 μm to 5 μm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor die including the bond pads. The film layer is provided around the bond pads. When the die are brought together, the bond pads may bond to each other, and the film layers on the respective die may bond to each other. Such a bonding technique may be referred to as hybrid bonding. In embodiments using hybrid bonding, the bond pads may be about 5 μm square and spaced from each other with a pitch of 1 μm to 5 μm.

Bonding techniques may be used providing bond pads with even smaller sizes and pitches.

Some embodiments may include a film on surface of the dies 201, 211. Where no such film is initially provided, a space between the die may be under filled with an epoxy or other resin or polymer. The under-fill material may be applied as a liquid which then hardens into a solid layer. This under-fill step protects the electrical connections between the dies 201, 211, and further secures the die together. Various materials may be used as under-fill material.

Figure 3C:
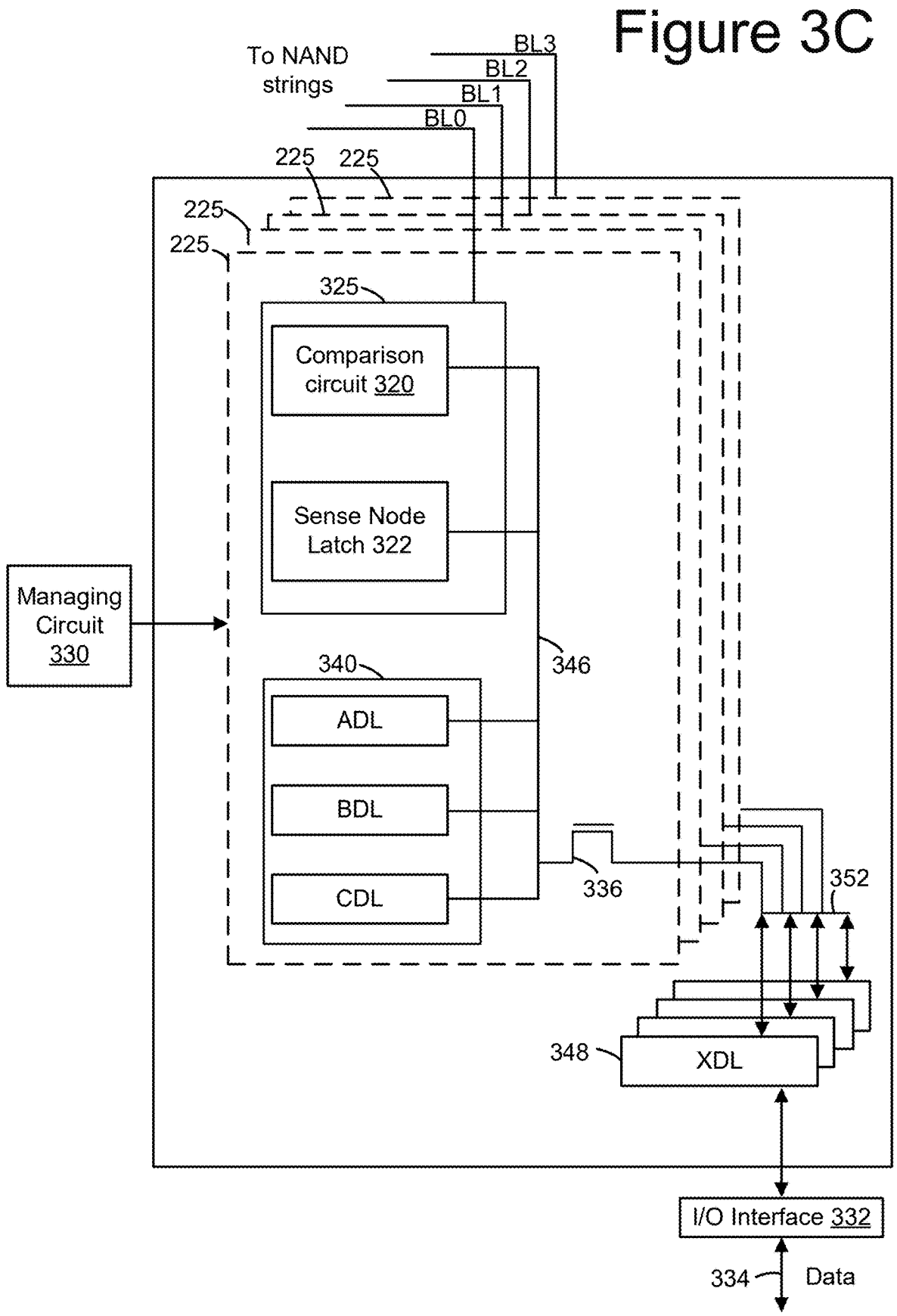
FIG. 3C is a block diagram depicting one embodiment of a portion of column control circuitry that contains a number of read/write circuits.

FIG. 3C is a block diagram depicting one embodiment of a portion of column control circuitry 210 that contains a number of read/write circuits 225. Each read/write circuit 225 is partitioned into a sense amplifier 325 and data latches 340. A managing circuit 330 controls the read/write circuits 225. The managing circuit 330 may communicate with state machine 262. In one embodiment, each sense amplifier 325 is connected to a respective bit line. Each bit line may be connected, at one point in time, to one of a large number of different NAND strings. A select gate on the NAND string may be used to connect the NAND string channel to the bit line.

Each sense amplifier 325 operates to provide voltages to one of the bit lines (see BL0, BL1, BL2, BL3) during program, verify, erase, and read operations. Sense amplifiers are also used to sense the condition (e.g., data state) of a memory cell in a NAND string connected to the bit line that connects to the respective sense amplifier. The following will discuss use of the sense amplifier 325 to sense a condition (e.g., data state) of a memory cell.

Each sense amplifier 325 may have a sense node. During sensing, a sense node is charged up to an initial voltage, Vsense_init, such as 3V. The sense node is then connected to the bit line for a sensing time, and an amount of decay of the sense node is used to determine whether a memory cell is in a conductive or non-conductive state. The amount of decay of the sense node also indicates whether a current Icell in the memory cell exceeds a reference current, Iref. A larger decay corresponds to a larger current. If Icell<=Iref, the memory cell is in a non-conductive state and if Icell>Iref, the memory cell is in a conductive state. In an embodiment, the sense node has a capacitor that is pre-charged and then discharged for the sensing time.

In particular, the comparison circuit 320 determines the amount of decay by comparing the sense node voltage to a trip voltage after the sensing time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the program verify voltage. A sense node latch 322 is set to 0 or 1, for example, by the comparison circuit 320 based on whether the memory cell is in a conductive or non-conductive state, respectively. The bit in the sense node latch 322 can also be used in a lockout scan to decide whether to set a bit line voltage to an inhibit or a program enable level in a next program loop. The bit in the sense node latch 322 can also be used in a lockout mode to decide whether to set a bit line voltage to a sense voltage or a lockout voltage in a read operation.

The data latches 340 are coupled to the sense amplifier 325 by a local data bus 346. The data latches 340 include three latches (ADL, BDL, CDL) for each sense amplifier 325 in this example. More or fewer than three latches may be included in the data latches 340. In one embodiment, for programming each data latch 340 is used to store one bit to be stored into a memory cell and for reading each data latch 340 is used to store one bit read from a memory cell. In a three bit per memory cell embodiment, ADL stores a bit for a lower page of data, BDL stores a bit for a middle page of data, CDL stores a bit for an upper page of data. Each read/write circuit 225 is connected to an XDL latch 348 by way of an XDL bus 352. In this example, transistor 336 connects local data bus 346 to XDL bus 352. An I/O interface 332 is connected to the XDL latches 348. The XDL latch 348 associated with a particular read/write circuit 225 serves as an interface latch for storing/latching data from the memory controller.

Managing circuit 330 performs computations, such as to determine the data stored in the sensed memory cell and store the determined data in the set of data latches. Each set of data latches 340 is used to store data bits determined by managing circuit 330 during a read operation, and to store data bits imported from the data bus 334 during a program operation which represent write data meant to be programmed into the memory. I/O interface 332 provides an interface between XDL latches 348 and the data bus 334.

During reading, the operation of the system is under the control of state machine 262 that controls the supply of different control gate voltages to the addressed memory cell. As it steps through the various predefined control gate voltages corresponding to the various memory states supported by the memory, the sense circuit may trip at one of these voltages and a corresponding output will be provided from the sense amplifier to managing circuit 330. At that point, managing circuit 330 determines the resultant memory state by consideration of the tripping event(s) of the sense circuit and the information about the applied control gate voltage from the state machine. It then computes a binary encoding for the memory state and stores the resultant data bits into data latches 340.

During program or verify operations for memory cells, the data to be programmed (write data) is stored in the set of data latches 340 from the data bus 334 by way of XDL latches 348. The program operation, under the control of the state machine 262, applies a series of programming voltage pulses to the control gates of the addressed memory cells. Each voltage pulse may be stepped up in magnitude from a previous program pulse by a step size in a process referred to as incremental step pulse programming. In one embodiment, each program voltage is followed by a verify operation to determine if the memory cells have been programmed to the desired memory state. In some cases, managing circuit 330 monitors the read back memory state relative to the desired memory state. When the two agree, managing circuit 330 sets the bit line in a program inhibit mode such as by updating its latches. This inhibits the memory cell coupled to the bit line from further programming even if additional program pulses are applied to its control gate.

Figure 4:
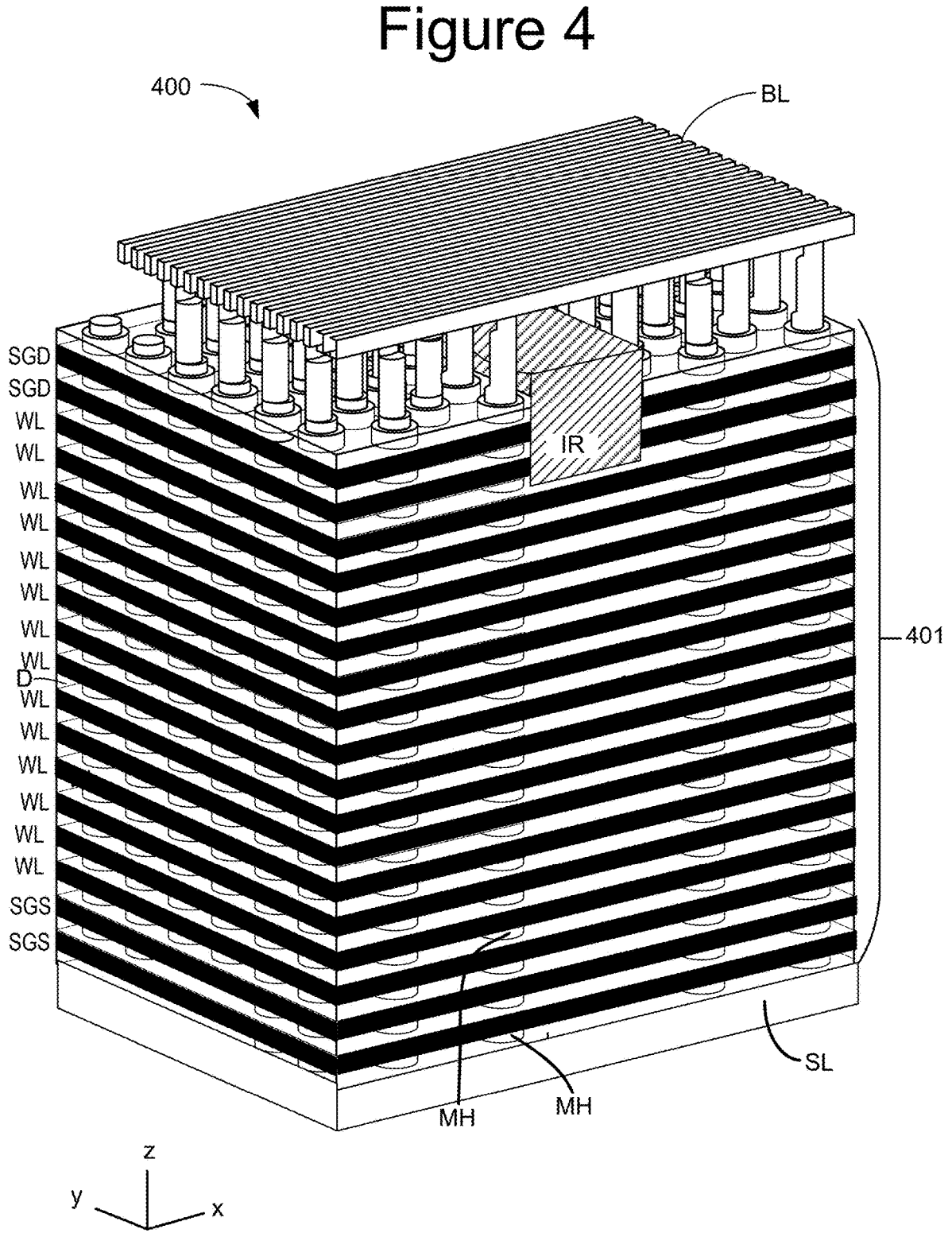
FIG. 4 is a perspective view of a portion of one example embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example purposes, one of the dielectric layers is marked as D. The conductive layers are labeled as one of: SGD, WL, or SGS. An SGD conductive layer serves as drain side select lines. A WL conductive layer serves as a word line. An SGS conductive layer serves as a source side select line. The numbers of each of these conductive layers is limited for ease of illustration. The number of alternating dielectric layers and conductive layers can vary based on specific implementation requirements. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

In one embodiment the block is operated as a number of "sub-blocks." Each of these "sub-blocks" has many NAND strings. In an embodiment, an isolation region (IR) divides the SGD layers into multiple SGD select lines, each of which is used to select a sub-block (e.g., set of NAND strings). FIG. 4 depicts an example having one IR region and thereby two strings. However, there may be more than one IR region and thereby more than two sub-blocks. Optionally, the IR region can extend down through all of the alternating dielectric layers and conductive layers.

Figure 4A:
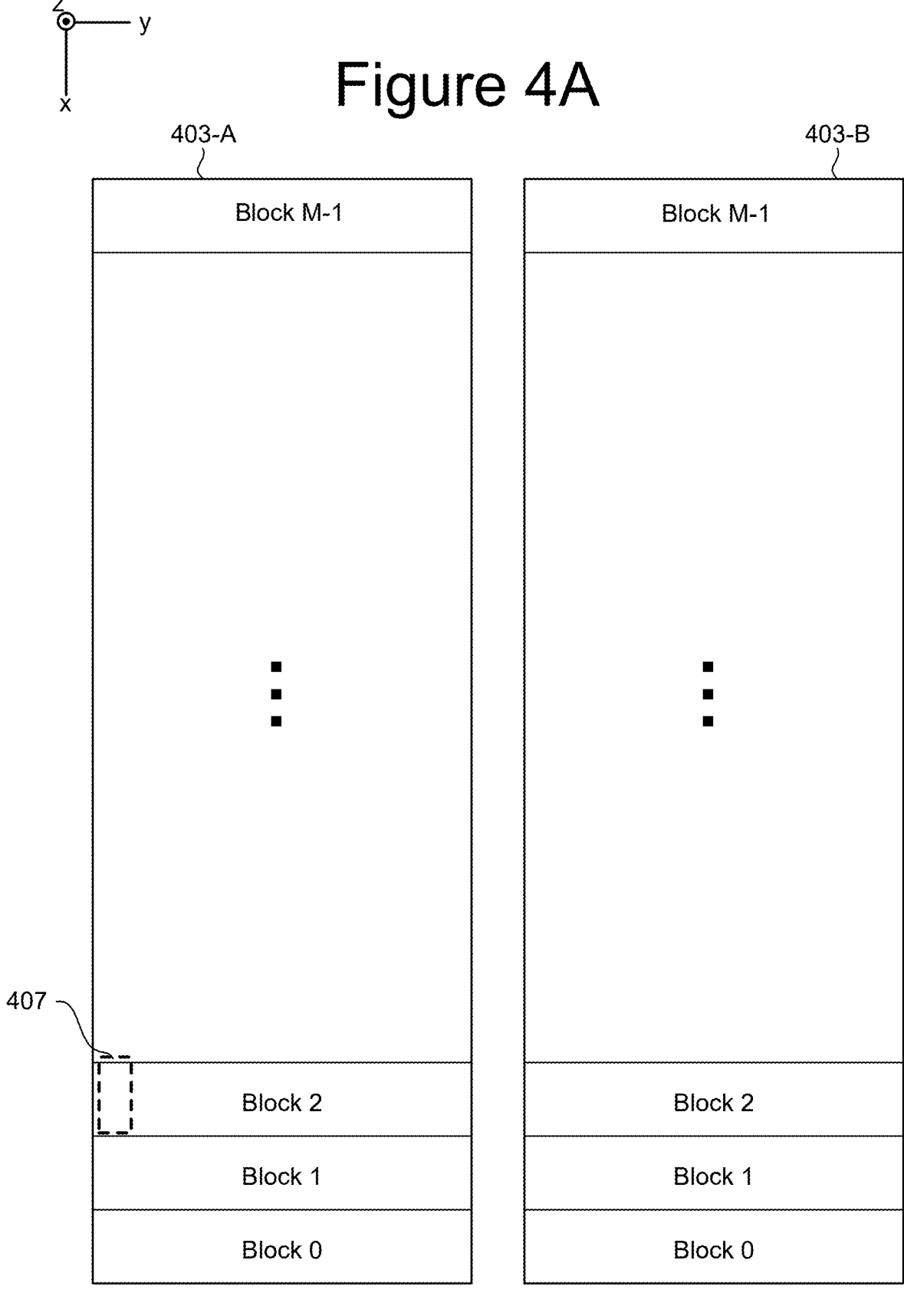
FIG. 4A is a block diagram of one embodiment of a memory structure having two planes.

FIG. 4A is a block diagram explaining one example organization of memory structure 202, which is divided into two planes 403-A and 403-B. Each plane 403 is then divided into M physical blocks. In one example, each plane has about 2000 physical blocks (or more briefly "blocks"). However, different numbers of blocks and planes can also be used. In one "full-block" embodiment, a block of memory cells is a unit of erase. That is, all memory cells of a block are erased together. In a "sub-block mode" embodiment, blocks are divided into sub-blocks and the sub-blocks are the unit of erase. In an embodiment, a block contains a number of word lines with each sub-block containing a unique set of the data word lines. In an embodiment, each plane 403-A, 403-B has a set of bit lines that extend across all of the blocks in that plane. In an embodiment, one block per plane is selected at a time. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all of the vertical NAND strings for that block. Although FIG. 4A shows two planes 403-A, 403-B more or fewer than two planes can be implemented. In some embodiments, memory structure 202 includes four planes. In some embodiments, memory structure 202 includes eight planes. In some embodiments, programming can be performed in parallel in a first selected block in plane 403-A and a second selected block in plane 403-B.

Figure 4B:
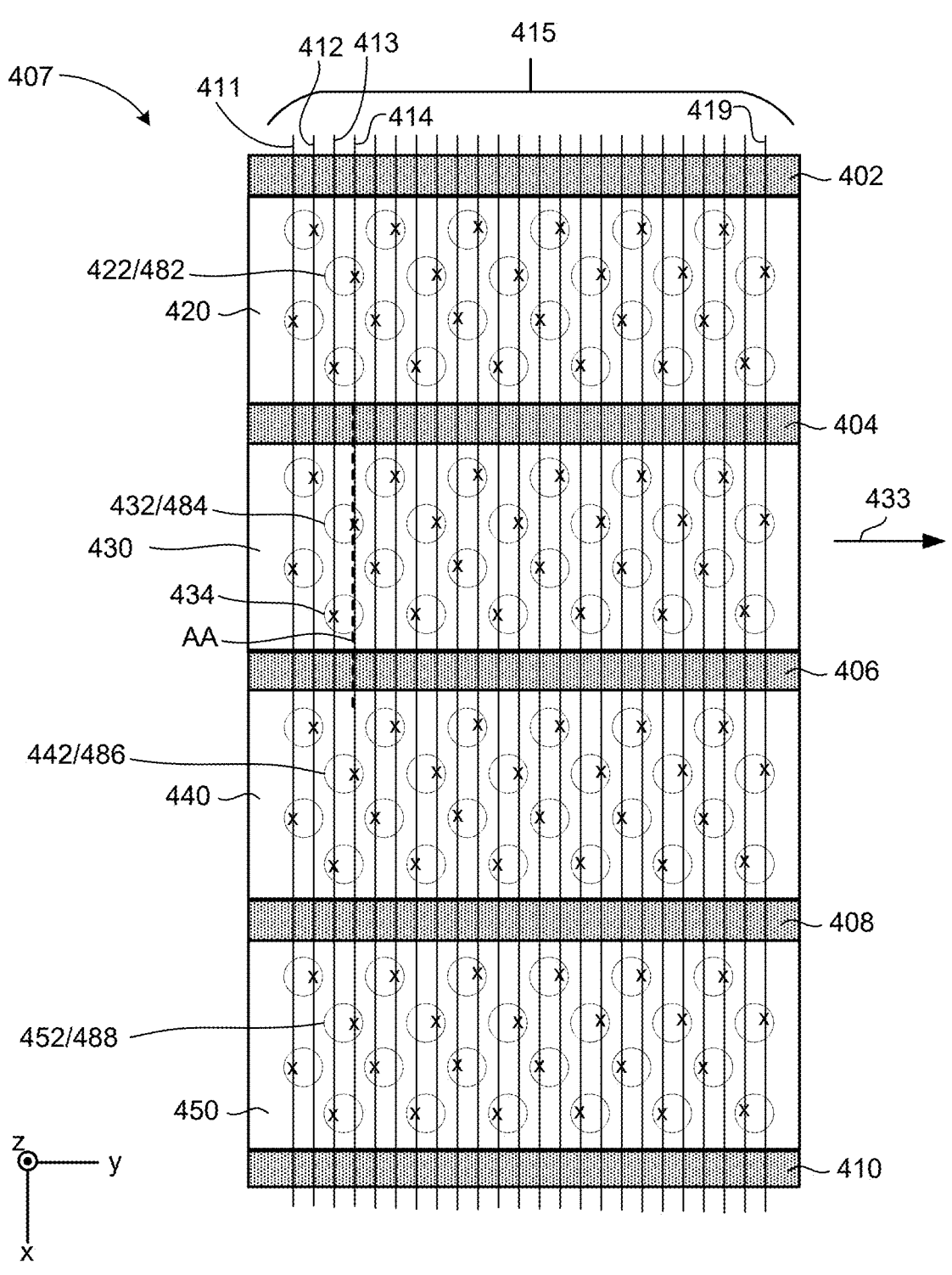
FIG. 4B is a block diagram depicting a top view of a portion of block of memory cells showing an array region.

FIGS. 4B-4E depict an example three dimensional ("3D") NAND structure that corresponds to the structure of FIG. 4 and can be used to implement memory structure 202 of FIGS. 2A and 2B. FIG. 4B is a diagram depicting a top view of a portion 407 of Block 2. As can be seen from FIG. 4B, the physical block depicted in FIG. 4B extends in the direction of arrow 433. In one embodiment, the memory array has many layers; however, FIG. 4B only shows the top layer.

FIG. 4B depicts a plurality of circles that represent the vertical columns. Each of the vertical columns include multiple select transistors (also referred to as a select gate or selection gate) and multiple memory cells. In one embodiment, each vertical column implements a NAND string. For example, FIG. 4B depicts vertical columns 422, 432, 442, and 452. Vertical column 422 implements NAND string 482. Vertical column 432 implements NAND string 484. Vertical column 442 implements NAND string 486. Vertical column 452 implements NAND string 488. More details of the vertical columns are provided below. Since the physical block depicted in FIG. 4B extends in the direction of arrow 433, the physical block includes more vertical columns than depicted in FIG. 4B.

FIG. 4B also depicts a set of bit lines 415, including bit lines 411, 412, 413, 414, . . . 419. FIG. 4B shows twenty-four bit lines because only a portion of the physical block is depicted. It is contemplated that more than twenty-four bit lines connected to vertical columns of the physical block. Each of the circles representing vertical columns has an "x" to indicate its connection to one bit line. For example, bit line 414 is connected to vertical columns 422, 432, 442 and 452.

The physical block depicted in FIG. 4B includes a set of isolation regions 402, 404, 406, 408, and 410, which are formed of SiO$_2$; however, other dielectric materials can also be used. Isolation regions 402, 404, 406, 408, and 410 serve to divide the top layers of the physical block into four regions; for example, the top layer depicted in FIG. 4B is divided into regions 420, 430, 440, and 450, which are referred to herein as "strings. Each string contains a large number of NAND strings. In one embodiment, isolation regions 402 and 410 separate the physical block 407 from adjacent physical blocks. Thus, isolation regions 402 and 410 may extend down to the substrate. In one embodiment, the isolation regions 404, 406, and 408 only divide the layers used to implement select gates so that NAND strings in different strings can be independently selected. Referring back to FIG. 4, the IR region may correspond to any of isolation regions 404, 406, or 408. In one example implementation, a bit line only connects to one vertical column/ NAND string in each of regions (sub-blocks) 420, 430, 440, and 450. In that implementation, each physical block has sixteen rows of active columns and each bit line connects to four NAND strings in each block. In one embodiment, all of the four vertical columns/NAND strings connected to a common bit line are connected to the same word line (or set of word lines); therefore, the system uses the drain side selection lines to choose one (or another subset) of the four to be subjected to a memory operation (program, verify, read, and/or erase).

Although FIG. 4B shows each region (420, 430, 440, 450) having four rows of vertical columns, four regions (420, 430, 440, 450) and sixteen rows of vertical columns in a block, those exact numbers are an example implementation. Other embodiments may include more or fewer regions (420, 430, 440, 450) per block, more or fewer rows of vertical columns per region and more or fewer rows of vertical columns per block. FIG. 4B also shows the vertical columns being staggered. In other embodiments, different patterns of staggering can be used. In some embodiments, the vertical columns are not staggered.

Figure 4C:
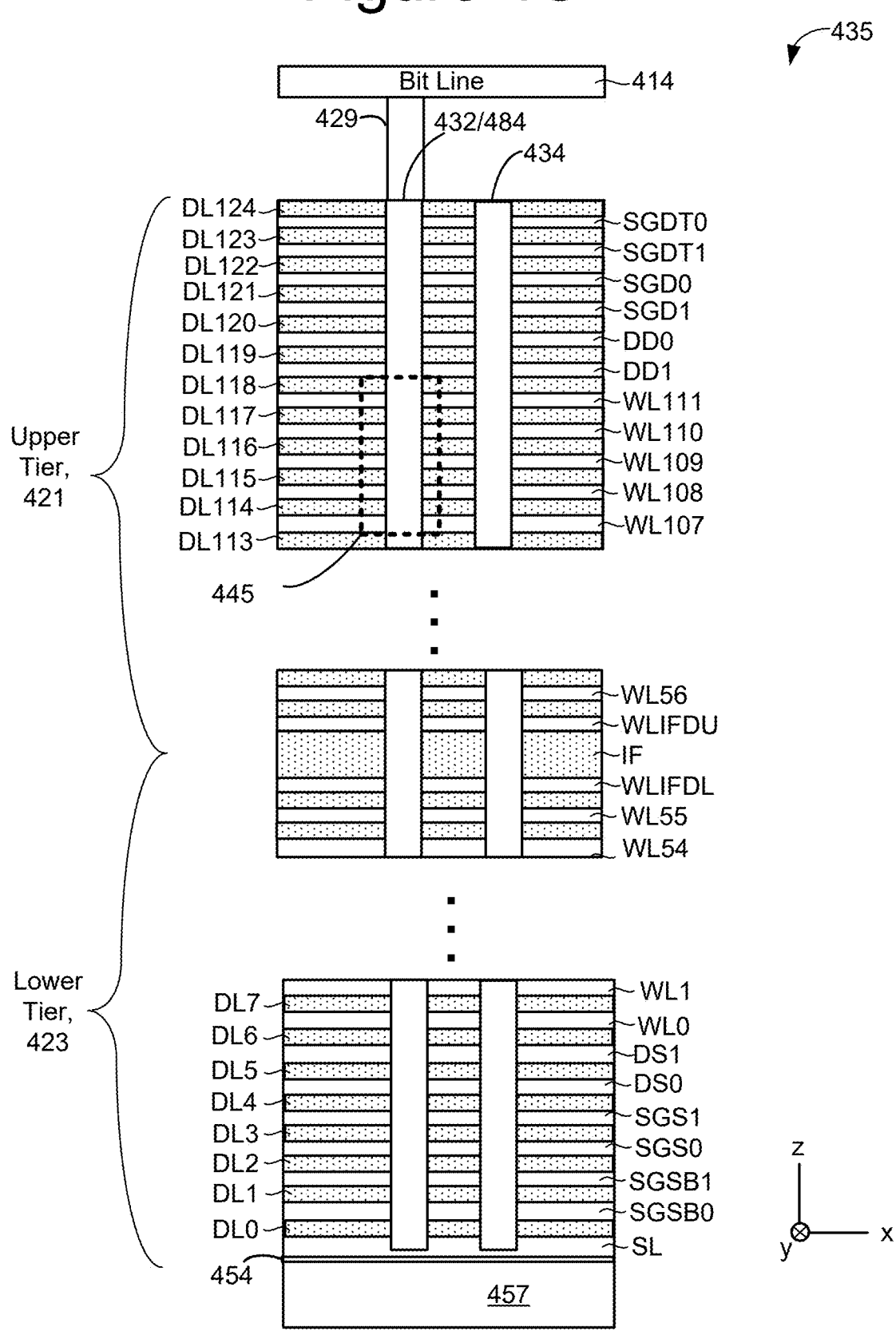
FIG. 4C depicts an example of a stack showing a cross-sectional view along line AA of FIG. 4B.

FIG. 4C depicts an example of a stack 435 showing a cross-sectional view along line AA of FIG. 4B. The SGD layers include SGDT0, SGDT1, SGD0, and SGD1. The SGD layers may have more or fewer than four layers. The SGS layers includes SGSB0, SGSB1, SGS0, and SGS1. The SGS layers may have more or fewer than four layers. Six dummy word line layers DD0, DD1, WLIFDU, WLIDDL, DS1, and DS0 are provided, in addition to the data word line layers WL0-WL111. There may be more or fewer than 112 data word line layers and more or fewer than six dummy word line layers. Each NAND string has a drain side select gate at the SGD layers. Each NAND string has a source side select gate at the SGS layers. Also depicted are dielectric layers DL0-DL124.

Columns 432, 434 of memory cells are depicted in the multi-layer stack. The stack includes a substrate 457, an insulating film 454 on the substrate, and a portion of a source line SL. A portion of the bit line 414 is also depicted. Note that NAND string 484 is connected to the bit line 414. NAND string 484 has a source-end at a bottom of the stack and a drain-end at a top of the stack. The source-end is connected to the source line SL. A conductive via 429 connects the drain-end of NAND string 484 to the bit line 414.

In one embodiment, the memory cells are arranged in NAND strings. The word line layers WL0-WL111 connect to memory cells (also called data memory cells). Dummy word line layers DD0, DD1, DS0 and DS1 connect to dummy memory cells. A dummy memory cell does not store and is not eligible to store host data (data provided from the host, such as data from a user of the host), while a data memory cell is eligible to store host data. In some embodiments, data memory cells and dummy memory cells may have the same structure. Drain side select layers SGD are used to electrically connect and disconnect (or cut off) the channels of respective NAND strings from bit lines. Source side select layers SGS are used to electrically connect and disconnect (or cut off) the channels of respective NAND strings from the source line SL.

FIG. 4C depicts an example of a stack 435 having two tiers (lower tier 423, upper tier 421). A two tier or other multi-tier stack can be used to form a relatively tall stack while maintaining a relatively narrow memory hole width (or diameter). After the layers of the lower tier are formed, memory hole portions are formed in the lower tier. Subsequently, after the layers of the upper tier are formed, memory hole portions are formed in the upper tier, aligned with the memory hole portions in the lower tier to form continuous memory holes from the bottom to the top of the stack. The resulting memory hole is narrower than would be the case if the hole were etched from the top to the bottom of the stack rather than in each tier individually. An interface (IF) region is created where the two tiers are connected. The IF region is typically thicker than the other dielectric layers. Due to the presence of the IF region, the adjacent word line layers suffer from edge effects such as difficulty in programming or erasing. These adjacent word line layers can therefore be set as dummy word lines (WLIFDL, WLIFDU). In some embodiments, the tiers are erased independent of one another. Hence, data may be maintained in the upper tier 421 after the lower tier 423 is erased. Likewise, data may be maintained in the lower tier 423 after upper tier 421 is erased.

Figure 4D:
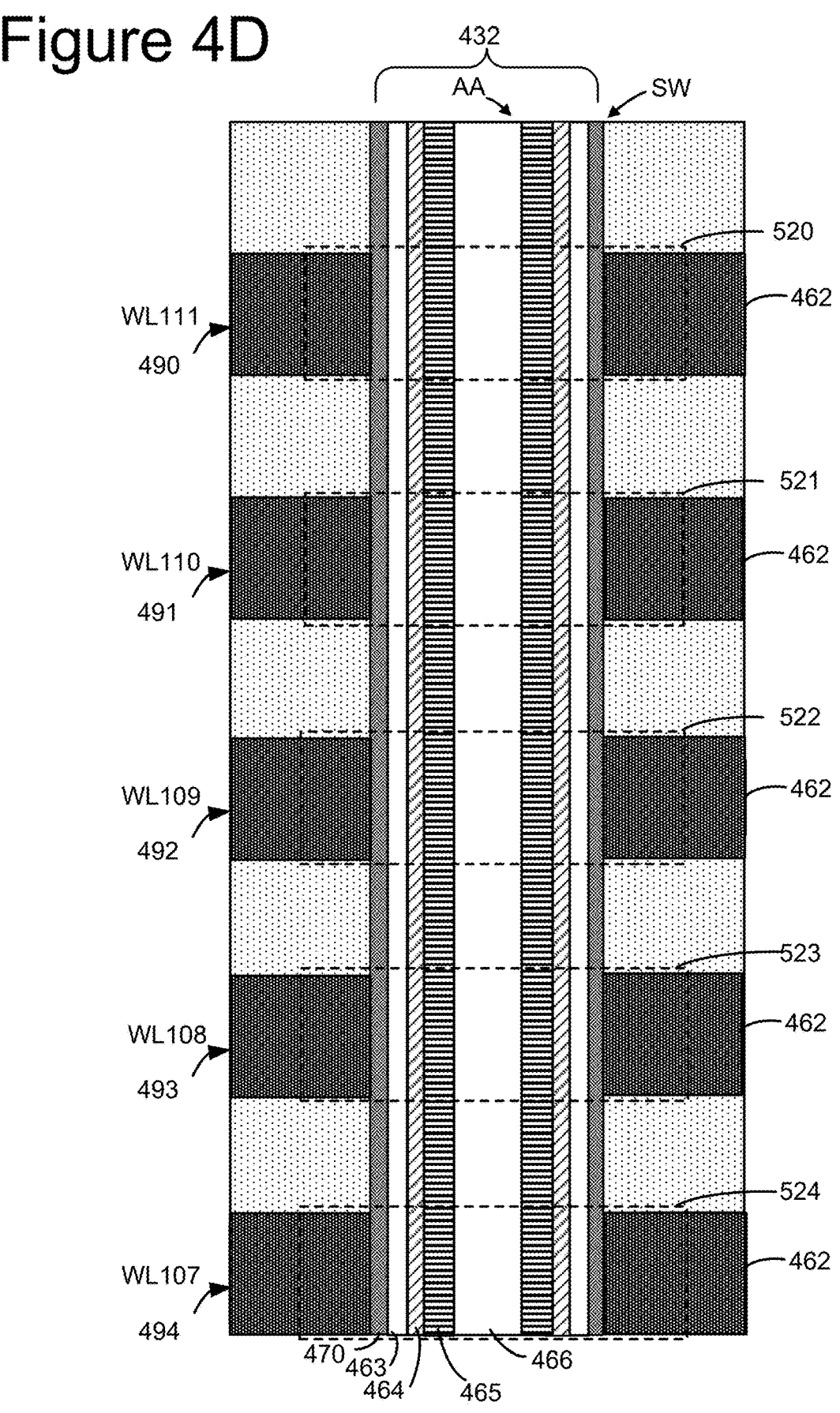
FIG. 4D depicts a view of the region 445 of FIG. 4C.

FIG. 4D depicts a view of the region 445 of FIG. 4C. Data memory cell transistors 520, 521, 522, 523, and 524 are indicated by the dashed lines. A number of layers can be deposited along the sidewall (SW) of the memory hole 432 and/or within each word line layer, e.g., using atomic layer deposition. For example, each column (e.g., the pillar which is formed by the materials within a memory hole) can include a blocking oxide/block high-k material 470, charge-trapping layer or film 463 such as SiN or other nitride, a tunneling layer 464, a polysilicon body or channel 465, and a dielectric core 466. A word line layer can include a conductive metal 462 such as Tungsten as a control gate. For example, control gates 490, 491, 492, 493 and 494 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a data memory cell transistor is programmed, electrons are stored in a portion of the charge-trapping layer which is associated with the data memory cell transistor. These electrons are drawn into the charge-trapping layer from the channel, and through the tunneling layer. The Vt of a data memory cell transistor is increased in proportion to the amount of stored charge. During an erase operation, the electrons return to the channel.

Each of the memory holes can be filled with a plurality of annular layers (also referred to as memory film layers) comprising a blocking oxide layer, a charge trapping layer, a tunneling layer and a channel layer. A core region of each of the memory holes is filled with a body material, and the plurality of annular layers are between the core region and the WLLs in each of the memory holes. In some cases, the tunneling layer 464 can comprise multiple layers such as in an oxide-nitride-oxide configuration.

Figure 4E:
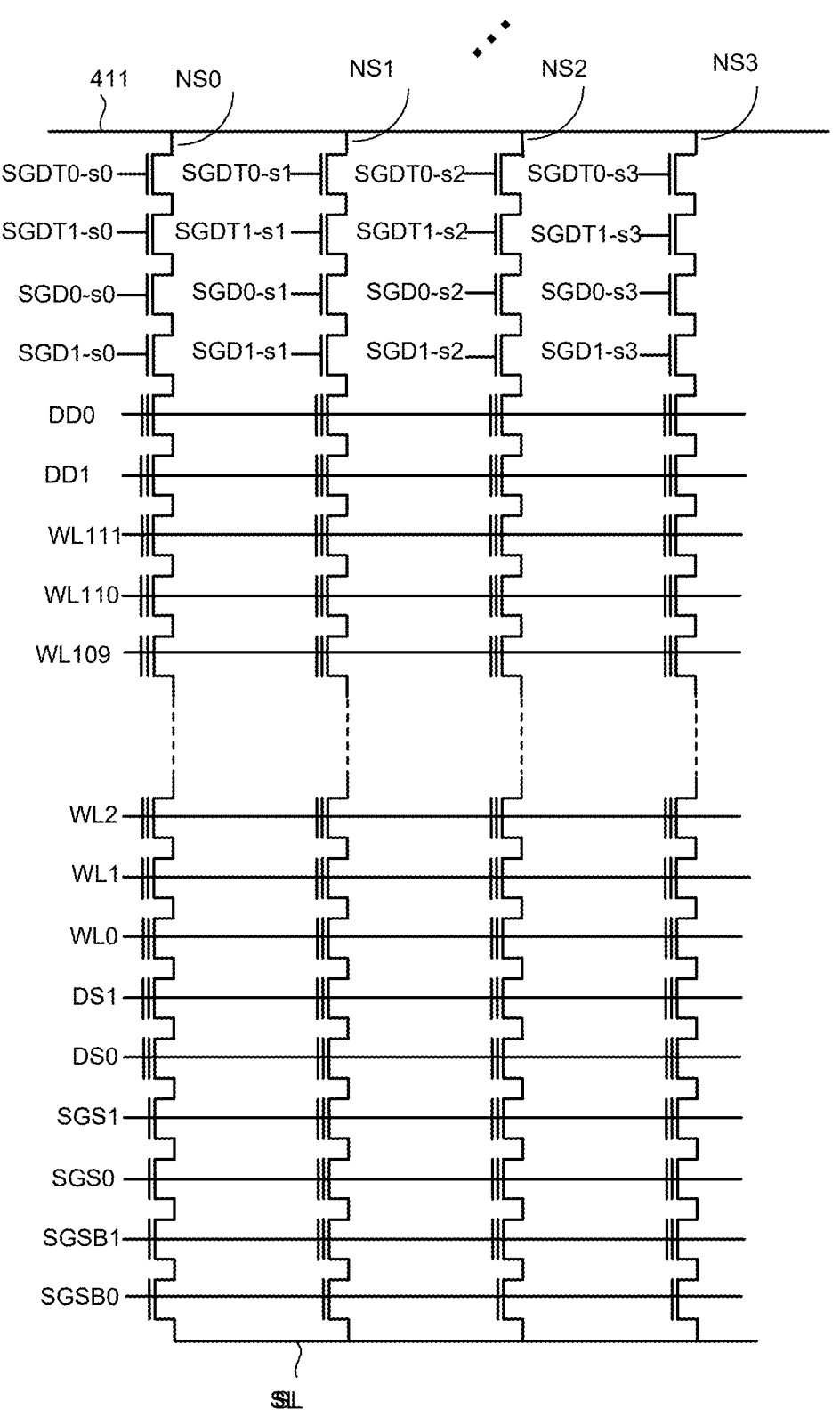
FIG. 4E is a schematic diagram of a portion of one embodiment of a block, depicting several NAND strings.

FIG. 4E is a schematic diagram of a portion of the memory array 202. FIG. 4E shows physical data word lines WL0-WL111 running across the entire block. The structure of FIG. 4E corresponds to a portion 407 in Block 2 of FIG. 4A, including bit line 411. Within the physical block, in one embodiment, each bit line is connected to four NAND strings. Thus, FIG. 4E shows bit line 411 connected to NAND string NS0, NAND string NS1, NAND string NS2, and NAND string NS3.

In one embodiment, there are four sets of drain side select lines in the physical block. For example, the set of drain side select lines connected to NS0 include SGDT0-*s0*, SGDT1-*s0*, SGD0-*s0*, and SGD1-*s0*. The set of drain side select lines connected to NS1 include SGDT0-*s1*, SGDT1-*s1*, SGD0-*s1*, and SGD1-*s1*. The set of drain side select lines connected to NS2 include SGDT0-*s2*, SGDT1-*s2*, SGD0-*s2*, and SGD1-*s2*. The set of drain side select lines connected to NS3 include SGDT0-*s3*, SGDT1-*s3*, SGD0-*s3*, and SGD1-*s3*. Herein the term "SGD" may be used as a general term to refer to any one or more of the lines in a set of drain side select lines. In some embodiments, the same operating voltage is applied to SGDT0 and SGDT1. In some embodiments, the same operating voltage is applied to SGD0 and SGD1. In some erase embodiments, different operating voltage are applied to SGDT0/SGDT1 than to SGD0/SGD1. Note that SGDT0/SGDT1 are adjacent to the bit line. In some erase embodiments, a voltage applied to SGDT0/SGDT1 in combination with a bit line voltage may be used to generate a gate induced gate leakage (GIDL) current. Such a voltage applied to SGDT0/SGDT1 may be referred to herein as a GIDL voltage.

In an embodiment, each line in a given set may be operated independent from the other lines in that set to allow for different voltages to the gates of the four drain side select transistors on the NAND string. Moreover, each set of drain side select lines can be selected independent of the other sets. Each set drain side select lines connects to a group of NAND strings in the block. Only one NAND string of each group is depicted in FIG. 4E. These four sets of drain side select lines correspond to four "sub-blocks." A first sub-block corresponds to those vertical NAND strings controlled by SGDT0-*s0*, SGDT1-*s0*, SGD0-*s0*, and SGD1-*s0*. A second sub-block corresponds to those vertical NAND strings controlled by SGDT0-*s1*, SGDT1-*s1*, SGD0-*s1*, and SGD1-*s1*. A third sub-block corresponds to those vertical NAND strings controlled by SGDT0-*s2*, SGDT1-*s2*, SGD0-*s2*, and SGD1-*s2*. A fourth sub-block corresponds to those vertical NAND strings controlled by SGDT0-*s3*, SGDT1-*s3*, SGD0-*s3*, and SGD1-*s3*. As noted, FIG. 4E only shows the NAND strings connected to bit line 411. However, a full schematic of the block would show every bit line and four vertical NAND strings connected to each bit line.

Although the example memories of FIGS. 4-4E are three dimensional memory structure that includes vertical NAND strings with charge-trapping material, other 3D memory structures can also be used with the technology described herein.

Figure 5:
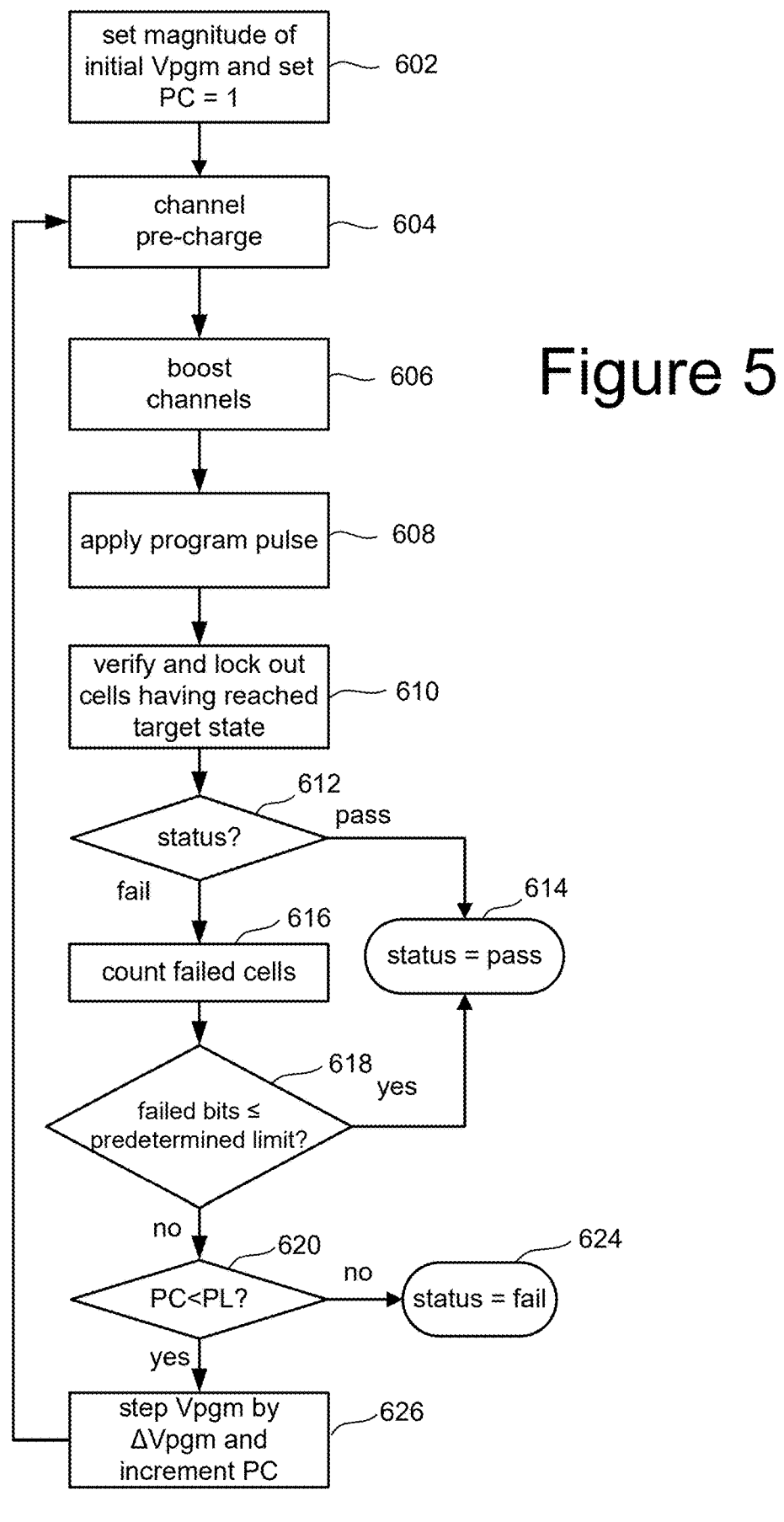
FIG. 5 is a flowchart describing one embodiment of a process for programming memory cells.

The storage systems discussed above can be erased, programmed and read. FIG. 5 is a flowchart describing one embodiment of a process for programming memory cells. For purposes of this document, the term program and programming are synonymous with write and writing. In one example embodiment, the process of FIG. 5 is performed for memory structure 202 using the one or more control circuits (e.g., system control logic 260, column control circuitry 210, row control circuitry 220) discussed above. In one example embodiment, the process of FIG. 5 is performed by integrated memory assembly 207 using the one or more control circuits (e.g., system control logic 260, column control circuitry 210, row control circuitry 220) of control die 211 to program memory cells on memory structure die 201. The process includes multiple loops, each of which includes a program phase and a verify phase. The process of FIG. 5 is performed to implement the full sequence programming, as well as other programming schemes including multi-stage programming. When implementing multi-stage programming, the process of FIG. 5 is used to implement any/each stage of the multi-stage programming process.

Typically, the program voltage applied to the control gates (via a selected data word line) during a program operation is applied as a series of program pulses (e.g., voltage pulses). Between programming pulses a set of verify pulses (e.g., voltage pulses) may be used to perform verification. In many implementations, the magnitude of the program pulses is increased with each successive pulse by a predetermined step size. In step 602 of FIG. 5, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts) to perform boosting schemes. A program inhibit voltage is applied to the bit lines coupled the unselected NAND string.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify reference levels. In one embodiment, the verification process is performed by testing whether the threshold voltages of the memory cells selected for programming have reached the appropriate verify reference voltage. In step 610, a memory cell may be locked out after the memory cell has been verified (by a test of the Vt) that the memory cell has reached its target state. For example, a memory cell may be locked out if it reaches a verify reference voltage.

If, in step 612, it is determined that all of the memory cells have reached their target threshold voltages (pass), the programming process is complete and successful because all selected memory cells were programmed and verified to their target states. A status of "PASS" is reported in step 614. Otherwise if, in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming fewer than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, then the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line so that another iteration (steps 604-926) of the programming process of FIG. 5 is performed.

Figures 6A, 6B:
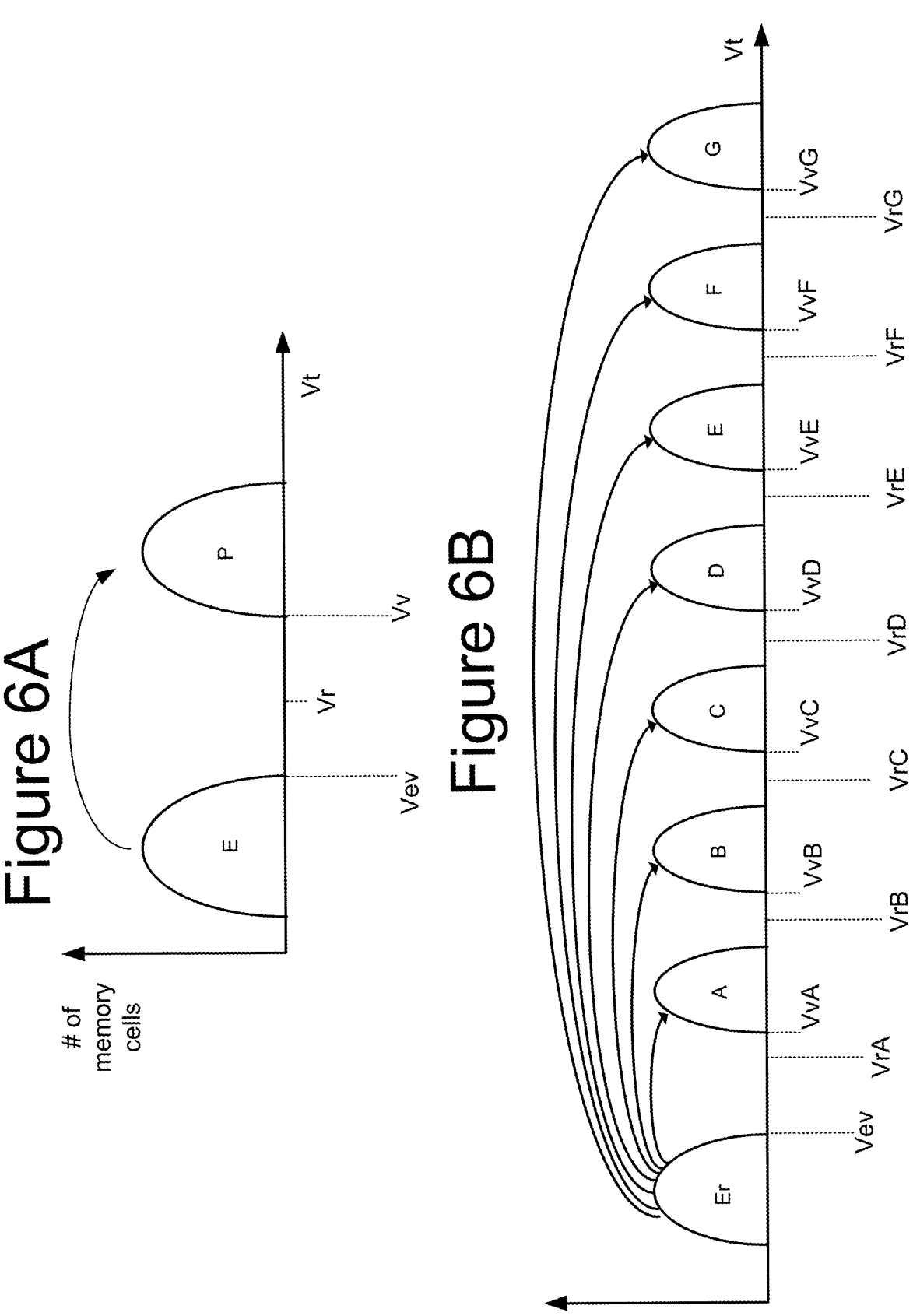
FIGS. 6A, 6B and 6C depict threshold voltage distributions.

At the end of a successful programming process, the threshold voltages of the memory cells should be within one or more distributions of threshold voltages for programmed memory cells or within a distribution of threshold voltages for erased memory cells, as appropriate. FIG. 6A a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 6A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 6A depicts read reference voltage Vr. By testing (e.g., performing one or more sense operations) whether the threshold voltage of a given memory cell is above or below Vr, the system can determine whether a memory cell is erased (state E) or programmed (state P). FIG. 6A also depicts verify reference voltage Vv. In some embodiments, when programming memory cells to data state P, the system will test whether those memory cells have a threshold voltage greater than or equal to Vv.

Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data.

In the example embodiment of FIG. 6B, each memory cell stores three bits of data. Other embodiments may use other data capacities per memory cell (e.g., such as two, four, or five bits of data per memory cell).

FIG. 6B shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. In an embodiment, the number of memory cells in each state is about the same.

FIG. 6B shows seven read reference voltages, VrA, VrB, VrC, VrD, VrE, VrF, and VrG for reading data from memory cells. By testing (e.g., performing sense operations) whether the threshold voltage of a given memory cell is above or below the seven read reference voltages, the system can determine what data state (i.e., A, B, C, D, . . . ) a memory cell is in. FIG. 6B also shows a number of verify reference voltages. The verify reference voltages are VvA, VvB, VvC, VvD, VvE, VvF, and VvG. In some embodiments, when programming memory cells to data state A, the system will test whether those memory cells have a threshold voltage greater than or equal to VvA. If the memory cell has a threshold voltage greater than or equal to VvA, then the memory cell is locked out from further programming. Similar reasoning applies to the other data states.

Figure 6C:
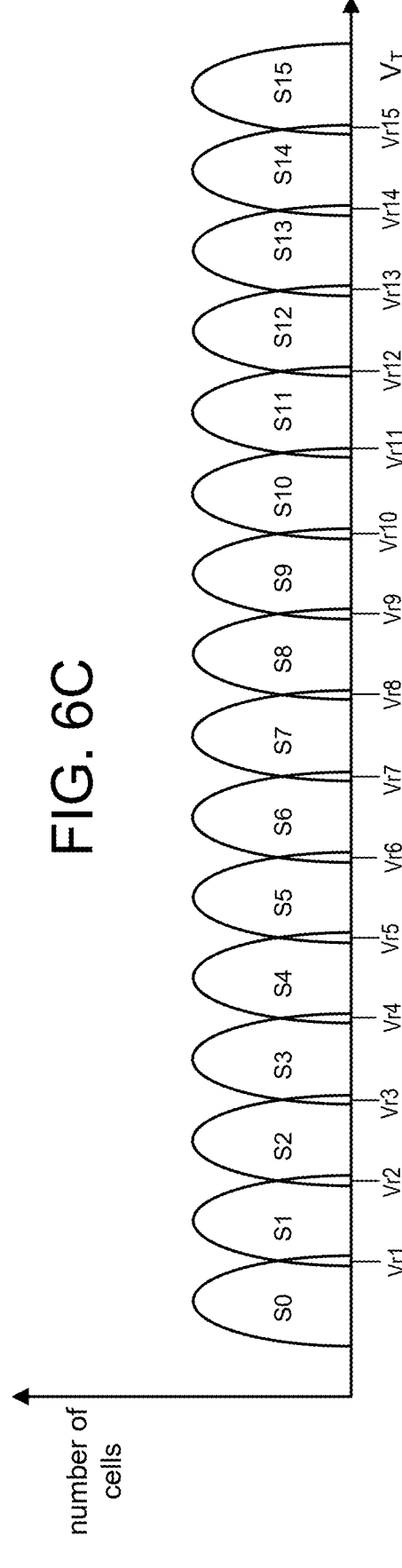

FIG. 6C illustrates example threshold voltage distributions for the memory array when each memory cell stores four bits of data. Other embodiments, however, may use other data capacities per memory cell (e.g., such as one, two, three, or five bits of data per memory cell). FIG. 6C shows 15 read reference voltages, Vr1-Vr15 for reading data from memory cells. The set of memory cells may be connected to the same word line. Each read reference level is used to distinguish between two adjacent threshold voltage distributions. Stated another way, each read reference level is used to distinguish between two adjacent data states. For example, read reference level Vr4 is used to distinguish between data states S3 and S4. Each read reference voltages Vr1-Vr15 used to distinguish between two adjacent threshold voltage distributions may be referred to herein as a "hard bit" reference voltage. By testing (e.g., performing sense operations) whether the threshold voltage of a given memory cell is above or below the 15 read reference voltages, the system can determine what data state (i.e., S0, S1, S2, S3 . . . ) a memory cell is in.

FIG. 6C depicts an example in which four bits are stored per memory cell. Thus, four pages may be stored in a set of memory cells. The set of memory cells may be connected to the same word line. These pages may be referred to as a lower page, lower-middle page, upper-middle page, and upper page. In one embodiment, in order to read the lower page, the memory cells are sensed using four different read reference voltages. For example, the memory cells may be sensed at Vr1, Vr4, Vr6, and Vr11 to read one of the pages.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

FIG. 6C depicts that there may be some overlap between the data states S0-S15. The overlap may occur due to factors such as memory cells changing charge over time, which is referred to herein as a data retention issue (or more briefly "data retention"). Some states tend to loss charge over time, and therefore may exhibit a drop in Vt over time. However, other states could gain charge over time, and therefor exhibit an increase in Vt over time. For some NAND memory cells there is a neutral Vt, which is a Vt that the memory cell will tend to move towards over time. Memory cells programmed to a Vt above the neutral Vt may tend to see a drop in Vt over time. Memory cells programmed to a Vt below the neutral Vt may tend to see an increase in Vt over time.

Over time, the locations of the threshold voltage distributions may change. A factor in this change may be data retention. Another factor is referred to as cross-temperature (TempX). Cross-temperature refers to programming the memory cells at one temperature and reading the memory cells at another temperature. The Vt of a NAND memory cell transistor may depend on the temperature, which leads to the TempX effect. Both data retention and TempX can increase the bit error rate, thereby increasing decoding time or even making decoding impossible. In one embodiment, adjusting the read reference levels may be used to compensate for the change in the locations of the Vt distributions. One technique for adjusting the reference levels is to change the magnitude of the read reference voltages. For example, the magnitude of one or more of the read reference voltages (Vr1-Vr15) may be dynamically updated. Data retention and TempX also impact NAND cells that are programmed to other than four bits per cell (e.g., two, three, five bits per cell). Therefore, dynamically adjusted read levels to compensate for both data retention and TempX can be applied for other MLC cells.

FIG. 7 is a flowchart of one embodiment of a process 700 of dynamically updating read levels to compensate for both data retention (DR) and cross-temperature (TempX). The process 700 may be used to read NAND memory cells such as, but not limited to, the example NAND memory architectures depicted in FIGS. 4-4E. Prior to process 700 the NAND memory cells are programmed to a number of data states. With reference to FIG. 6C, for example, each data state is associated with a Vt distribution. Programming the cells establishes a charge on each NAND memory cell. Process 700 may be used to read MLC NAND.

Step 702 includes sensing the memory cells at a first Vt distribution. Step 702 may include determining a shift to the first Vt distribution between programming and sensing. Step 702 may include determining a first count of a first number of memory cells within a first Vt range associated with the first threshold voltage distribution. In an embodiment, the first Vt distribution exhibits a greater Vt shift due to change in the temperature between programming and reading than due to change in the charge between programming and reading. In other words, the first Vt distribution exhibits a greater TempX effect than data retention effect. In an embodiment, the first Vt distribution is one of the lower Vt distributions. For example, with respect to FIG. 6C, the first Vt distribution might be any of S1, S2 S3, S4, or S5; however, this is for purpose of illustration. In an embodiment, the bitscan logic 235 is used to determine the shift.

Step 704 includes sensing the memory cells at a second Vt distribution. Step 704 may include determining a shift to the second Vt distribution between programming and sensing. Step 704 may include determining a second count of a first number of memory cells within a second threshold voltage range associated with the second Vt distribution. In an embodiment, the second Vt distribution exhibits a greater Vt shift due to change in the charge between programming and reading than due to change in the temperature between programming and reading. In other words, the second Vt distribution exhibits a greater a data retention effect than TempX effect. In an embodiment, the second Vt distribution is one of the higher Vt distributions. For example, with respect to FIG. 6C, the second Vt distribution might be any of S12, S13 S14, or S15; however, this is for purpose of illustration. In an embodiment, the bitscan logic 235 is used to determine the shift.

Steps 702 and 704 may include determining a TempX factor and a data retention factor based on sensing the group of memory cells at the first Vt distribution and the second Vt distribution. The TempX factor is related to a difference in temperature between programming the group and reading the group. The data retention factor is related to a difference in the charge between programming the group and sensing the group. In an embodiment, each factor includes a number of memory cells that are within a Vt range associated with the relevant Vt distribution. A greater number of memory cells indicates a greater effect. For example, a greater number of memory cells in the first count (see step 702) may indicate a greater shift in the first Vt distribution and therefore a greater TempX effect. A greater number of memory cells in the second count (see step 704) may indicate a greater shift in the second Vt distribution and therefore a greater data retention effect. In one embodiment, the TempX factor is based only on the sensing of the first Vt distribution and the data retention factor is based only on the sensing of the second Vt distribution. However, optionally, the TempX factor may be based on sensing at both the first Vt distribution and the second Vt distribution.

Step 706 includes determining one or more read reference offsets based on the first shift and the second shift. In an embodiment, one or more read reference offsets are determined based on a first bitscan count of the first Vt distribution and a second bitscan count of the second Vt distribution. In an embodiment, one or more read reference offsets are determined based on the TempX factor and the DR factor. Numerous techniques are disclosed herein for determining the one or more read reference offsets. In some embodiments, a first read reference offset is determined based on the first shift and a second read reference offset is determined based on the second shift. However, in another embodiment, both the first shift and the second shift are used together to determine a read reference offset.

Step 708 includes sensing the memory cells using a read reference voltage determined based on the one or more read reference offsets. Step 708 may be used for any of the read reference levels. The one or more read reference offsets may be added to a default level for the given read reference level. The one or more read reference offsets may each be a positive value or a negative value. In some rare cases, an offset could be zero. Note that different offsets may be used for different read reference levels. In some cases, the same offset may be used for more than one read reference levels. For example, the memory system could determine an offset for Vr1, an offset for both Vr2 and Vr3, etc.

Figures 8A, 8B:
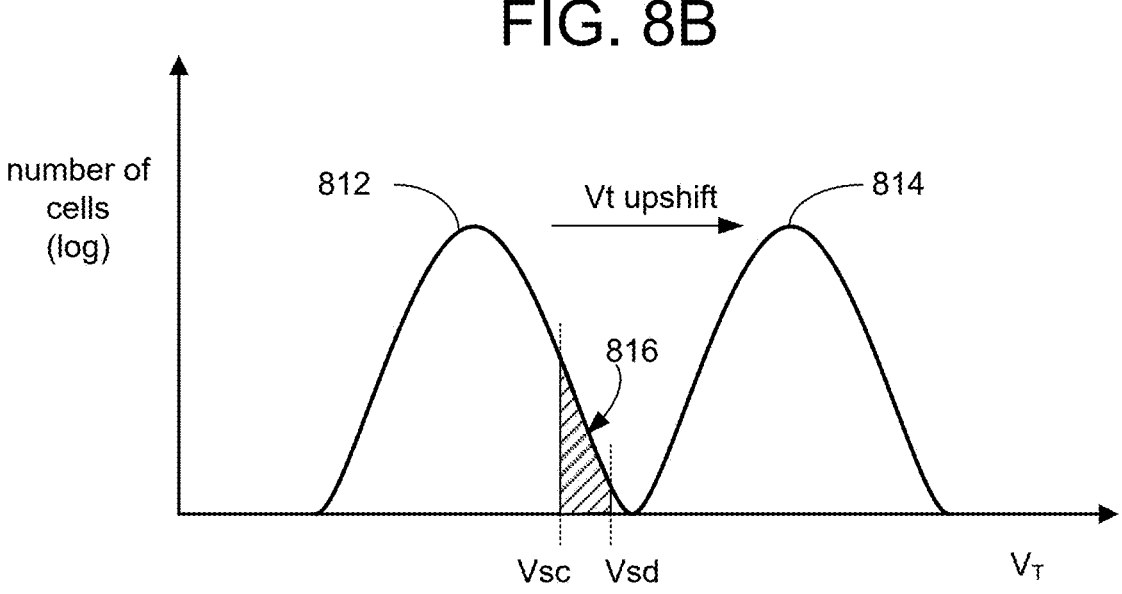
FIGS. 8A and 8B each show Vt distributions to illustrate how a bitscan may be performed to determine a TempX factor and a data retention factor.

FIGS. 8A and 8B each show Vt distributions to illustrate how a bitscan may be performed to determine a shifts to Vt distribution. In an embodiment, the bitscan may bs used to determine a TempX factor or a data retention factor. FIG. 8A shows a case in which there has been a Vt downshift in the two Vt distributions 802, 804 since programming. The two Vt distributions 802, 804 may be any two adjacent Vt distributions. The NAND memory cells are sensed for a range of Vt between Vsa and Vsb. The memory system (e.g., bitscan logic 235) counts how many cells have a Vt between Vsa and Vsb, which is referred to herein as a bitscan. Thus, the memory system will determine how many NAND cells are in region 806 of Vt distribution 804. The count of memory cells is an indication of the amount of Vt shift, with a greater number of memory cells indicating a greater Vt shift. In one embodiment, the memory system determines how many memory cells have a different result for sensing at Vsb relative to Vsa, which may be referred to as a "mis-compare." Such mis-compares are determined to be in region 806. For example, a memory cell having a Vt in region 806 should fail to turn on in response to Vsa, but should turn on in response to Vsb. The sensing at the two levels can be achieved using different techniques. One technique is to use the same sense time (integration time) for both levels, but to use different control gate voltages. Another technique is to use the same control gate voltage for each level, but to use different sense times (integration times) for each level.

FIG. 8B shows a case in which there has been a Vt upshift in the two Vt distributions 812, 814 since programming. The two Vt distributions 812, 814 may be any two adjacent Vt distributions. The NAND memory cells are sensed for a range of Vt between Vsc and Vsd. The memory system counts how many cells have a Vt between Vsc and Vsd, which is referred to herein as a bitscan. Thus, the memory system will determine how many NAND cells are in region 816 of Vt distribution 812.

In an embodiment, Vt distribution 804 is selected as a good candidate for testing because Vt distribution 804 exhibits a greater data retention effect than TempX effect. In an embodiment, Vt distribution 812 is selected as a good candidate for testing because Vt distribution 812 exhibits a greater TempX effect than data retention effect. Note that the TempX effect could result in either an upshift or downshift to a particular Vt distribution. Likewise, the DR effect could result in either an upshift or downshift to a particular Vt distribution. However, higher Vt distributions typically see a Vt downshift due to the DR effect.

Figures 9A, 9B:
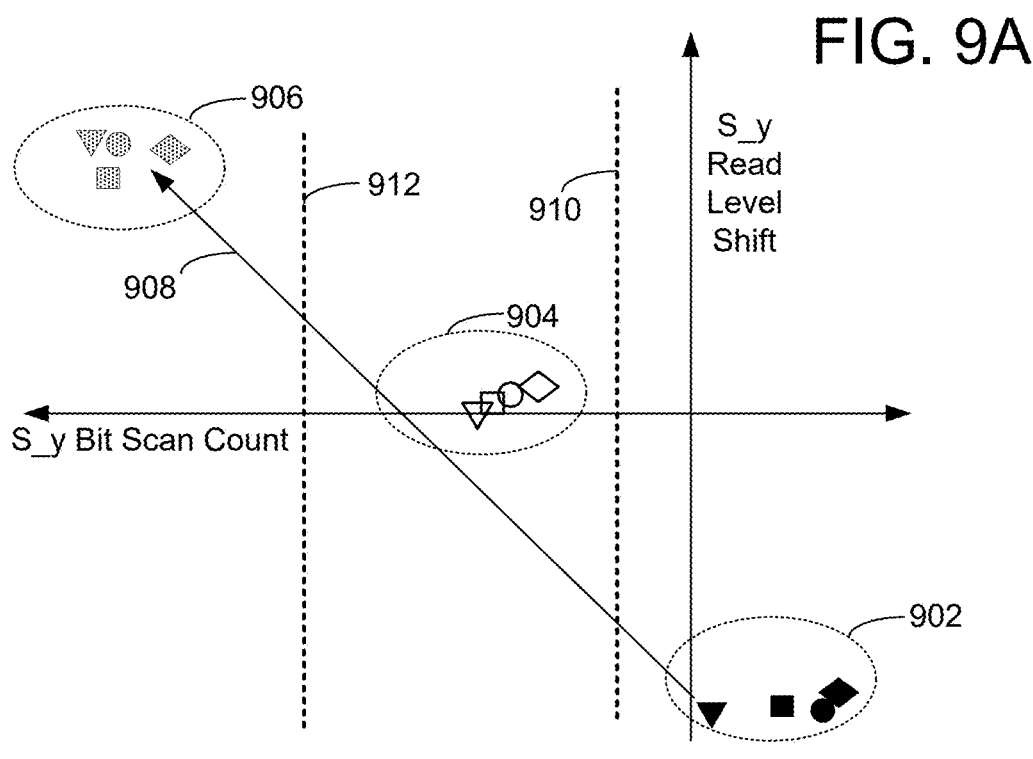
FIGS. 9A and 9B are graphs of bit scan counts versus read level shift.

FIGS. 9A and 9B are graphs of bit scan counts versus read level shift for two different states. FIG. 9A is for a data state referred to as state y (S_y). FIG. 9B is for a data state referred to as state x (S_x). State y is an example of a data state that exhibits a greater dependance on TempX than data retention. State y may be one of the lower data states (e.g., S1, S2, S3, S4, S5). State x is an example of a data state that exhibits a greater dependance on data retention than TempX. State x may be one of the higher data states (e.g., S12, S13, S14, S15).

Referring now to FIG. 9A, the x-axis is for a bitscan count for S_y. The bitscan count may be positive or negative depending on the direction of the Vt shift. The y-axis is for the read level shift to compensate for the shift in the Vt distribution for S_y. The read level shift could be positive or negative depending on the direction of the Vt shift. The datapoints encompassed by oval 902 are for a first cross temperature, datapoints encompassed by oval 904 are for a second cross temperature, and datapoints encompassed by oval 906 are for a third cross temperature. As an example, the datapoints encompassed by oval 902 may be for memory cells read at the same temperature as they were programmed, the datapoints encompassed by oval 904 may be for memory cells read at 30 degrees Celsius greater than they were programmed, the datapoints encompassed by oval 906 may be for memory cells read at 60 degrees Celsius greater than they were programmed. The four datapoints encompassed by each oval are for four different time periods between programmed and reading (and hence four different DR effects). Note that for each oval 902, 904, 906, the four datapoints are closely grouped indicating that the data retention impact is relatively small. However, the significant gap between each oval 902, 904, 906 indicates that the TempX impact is relatively large. Plot 908 shows the relationship between the different TempX (ovals 902, 904, 906). Thus, plot 908 shows the large TempX effect.

In an embodiment, the memory system determines a TempX effect based on the bitscan count for S_y. Plot 910 indicates a first threshold for the bitscan count and plot 912 indicates a second threshold for the bitscan count. These two thresholds may be used to identify one of the three TempX regions depicted in FIG. 9A. There may be more than three TempX regions.

Referring now to FIG. 9B, the x-axis is for a bitscan count for S_x. The bitscan count may be positive or negative depending on the direction of the Vt shift. The y-axis is for the read level shift to compensate for the shift in the Vt distribution for S_x. The read level shift could be positive or negative depending on the direction of the Vt shift. FIG. 9B uses the same scheme to depict the datapoints as was used in FIG. 9B. Datapoints of the same color were programmed and sensed at the same temperature, therefore such datapoints should not have a TempX effect. However, such datapoints of the color are separated by a significant amount, indicating a relatively strong data retention effect. Datapoints of the same shape but different color should have minimal DR effect, but may have some TempX effect. The TempX effect is seen to be less than the DR effect for S_x. Plot 918 represents the stronger dependance on data retention than TempX.

Figure 10:
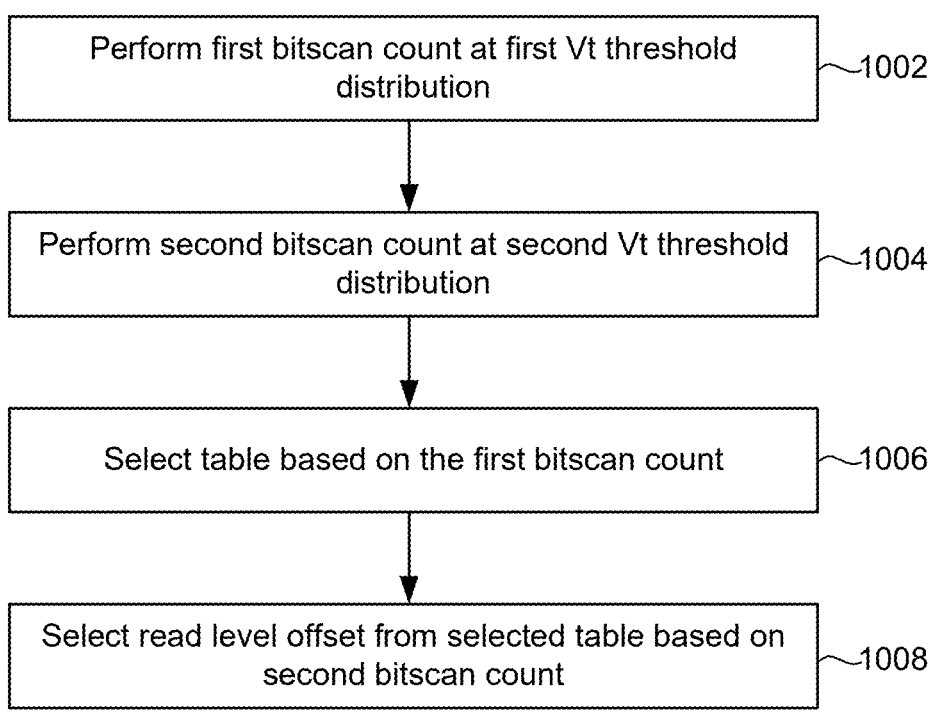
FIG. 10 is a flowchart of one embodiment of a process of dynamically updating read levels to compensate for both data retention and TempX.

FIG. 10 is a flowchart of one embodiment of a process 1000 of dynamically updating read levels to compensate for both data retention and TempX. The process 1000 may be used to read NAND memory cells such as, but not limited to, the example NAND memory architectures depicted in FIGS. 4-4E. Prior to 1000 the NAND memory cells are programmed to a number of data states. Process 1000 may be used to read MLC NAND. With reference to FIG. 6C, for example, each data state is associated with a Vt distribution. Process 1000 provides further details for an embodiment of process 700.

Step 1002 includes performing a bitscan count at a first Vt distribution. For example, the memory system performs a bitscan to determine how many memory cells are in region 806 of Vt distribution 804. Step 1002 may be used to determine a shift to the first Vt distribution. In an embodiment, the first Vt distribution exhibits a greater Vt shift due to change in the temperature between programming and reading than due to change in the charge between programming and reading. In other words, the first Vt distribution exhibits a greater TempX effect than data retention effect. In an embodiment, the first Vt distribution is one of the lower Vt ranges. For example, with respect to FIG. 6C, the first Vt distribution might be any of S1, S2 S3, S4, or S5; however, this is for purpose of illustration.

Step 1004 includes performing a bitscan count at a second Vt distribution. For example, the memory system performs a bitscan to determine how many memory cells are in region 816 of Vt distribution 812. Step 1004 may include determining a shift to the second Vt distribution. In an embodiment, the second Vt distribution exhibits a greater Vt shift due to change in the charge between programming and reading than due to change in the temperature between programming and reading. In other words, the second Vt distribution exhibits a greater a data retention effect than TempX effect. In an embodiment, the second Vt distribution is one of the higher Vt ranges. For example, with respect to FIG. 6C, the second Vt distribution might be any of S12, S13 S14, or S15; however, this is for purpose of illustration.

Step 1006 includes selecting a table based on the first bitscan count. FIG. 11A shows a first table that may be accessed to select the table in step 1006. The table 1100 in FIG. 11A links a bitscan count (e.g., TempX factor) to a table of read level offsets. The TempX factor includes the count from the bitscan of step 1002. If the bit count is in Range 1, then Table 1 is selected. If the bit count is in Range 2, then Table 2 is selected. If the bit count is in Range 3, then Table 3 is selected. The bit count ranges are non-overlapping ranges. Table 1 is for a first TempX. Table 2 is for a second TempX. Table 3 is for a third TempX. A higher bit count corresponds to a greater temperature difference between programming and sensing.

Returning to the discussion of FIG. 10, step 1008 includes selecting a read level offset from the selected table based on the second bitscan count. FIG. 11B shows an example of the table 1150 that may have been selected in step 1006. Other similar tables may instead be selected depending on the bit count from step 1006. Thus, other tables may provide for more or less compensation for TempX. Referring now to table 1150, each row corresponds to a different read level or read levels. For example, the parameter DVCG_S1R refers to an offset for S1, the parameter DVCG_S2S3R refers to an offset for S2 and S3, etc. One of the four columns labeled DR Zone1, DR Zone2, DR Zone3, and DR Zone4 is selected based on the second bitscan count from step 1004. The differences between these four columns may primarily be for data retention effect. Note that the read level offsets in table 1150 (and other offset tables discussed herein) may be expressed in what is referred to a DAC (a digital code). The DAC may be converted to a voltage by the memory system. After selecting one of the read level offsets for the pertinent state, the memory cells are sensed based on that read level offset. In one embodiment, the read level offset from table 1150 (or another TempX based table) is added to a default read voltage. Note that the values in table 1150 may be codes that are converted by the memory system to a voltage. Note also that the offsets in table 1150 may be positive, negative, or in some cases 0.

Figures 12A, 12B:
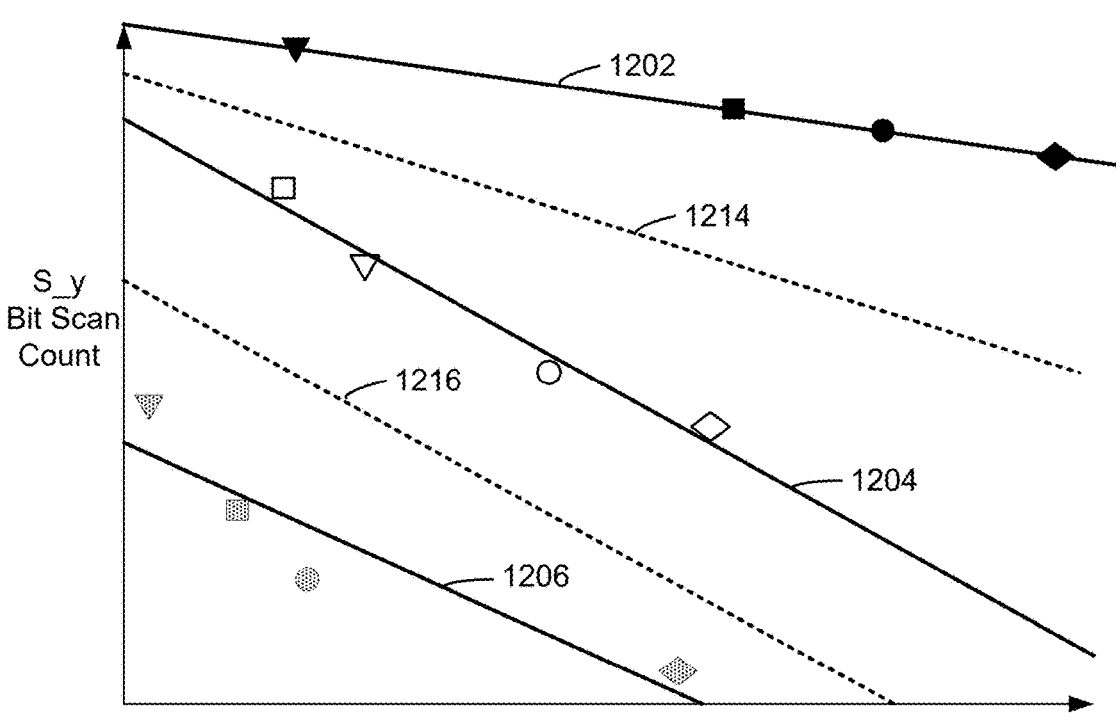
FIG. 12A is a graph of bitscan count of S_x versus S_y for different cross-temperatures and data retention times.
FIG. 12B depicts an embodiment of a table that may be used in connection with the graph of FIG. 12A to determine read level offsets.

FIG. 12A is a graph of bitscan count of S_x versus S_y for different cross-temperatures and data retention times. FIG. 12A will be referred to in order to discuss how a TempX may be determined from the bitscan counts of the two states (S_y and S_x). The x-axis is for the bitscan count for S_x. S_x may exhibit a greater Vt shift due to data retention than TempX. The y-axis is for the bitscan count for S_y. S_y may exhibit a greater Vt shift due to TempX than data retention. The data points in FIG. 12A are for different data retention times and different cross-temperatures. The black data points are different data retention times for a first cross-temperature. The white data points are different data retention times for a second cross-temperature. The dotted points are different data retention times for a third cross-temperature.

Plot 1202 correlates the data points for the first TempX. Plot 1204 correlates the data points for the second TempX. Plot 1206 correlates the data points for the third TempX. As one example, plot 1202 may be for a TempX of 0 degrees Celsius, plot 1204 may be for a TempX of +30 degrees Celsius, and plot 1206 may be for a TempX of +60 degrees Celsius. Plot 1214 is added between plot 1202 and plot 1204 such that the region above plot 1214 corresponds to the first TempX. Plot 1216 is added between plot 1204 and plot 1206 such that the region below plot 1216 corresponds to the third TempX. The region between plot 1214 and plot 1216 corresponds to the second TempX. In an embodiment the memory system will analyze the bitscan count for S_x and the bitscan count for S_x to determine which of the three TempX regions the S_x versus S_y bitscan falls into in order to determine the cross-temperature. The exact technique to use the S_x bitscan count and the S_y bitscan count to arrive at the TempX can vary.

In an embodiment, the memory system stores information that describes an equation for plot 1214 and an equation for plot 1216. For example, the following two equations may be used to represent plot 1214 and plot 1216, respectively.

$$Y1 = M1X - C1 \quad (1)$$
$$Y2 = M2X - C2 \quad (2)$$

In Equation 1, M1 is the slope of plot 1214 and C1 is the y-intercept. For example, C1 is the bitscan count for S_y when the bitscan count for S_x is zero for plot 1214. In Equation 2, M2 is the slope of plot 1216 and C2 is the y-intercept. For example, C2 is the bitscan count for S_y when the bitscan count for S_x is zero for plot 1216. The memory system may store the y-intercept and the slope for each equation, which requires only a small amount of memory. In one embodiment the memory system stores a slope table and an intercept table. Table I is an example of a slope table.

TABLE I

| Bit 1 | Bit 0 | Slope |
|---|---|---|
| 0 | 0 | −0.15 |
| 0 | 1 | −0.20 |
| 1 | 0 | −0.25 |
| 1 | 1 | −0.30 |

Table II is an example of an intercept table.

TABLE II

| Bit 1 | Bit 0 | Intercept |
|---|---|---|
| 0 | 0 | −50 |
| 0 | 1 | −100 |
| 1 | 0 | −150 |
| 1 | 1 | −200 |

FIG. 12B depicts an embodiment of a table 1250 that may be used in connection with the graph of FIG. 12A to determine read level offsets. Table 1250 contains three rows for a corresponding three different TempX zones. Each TempX zone is for a different range of TempX. Once the TempX is determined based on the bitscan counts of S_x and S_y (see graph in FIG. 12A), the memory system may use table 1250 to select a suitable read level offset for the state to be sensed. One option is to have an additional table to determine a data retention offset based on, for example, the bitscan count of S_x. The read level offset from table 1250 may be added to the read level offset from this second, data retention based, table.

Figure 13:
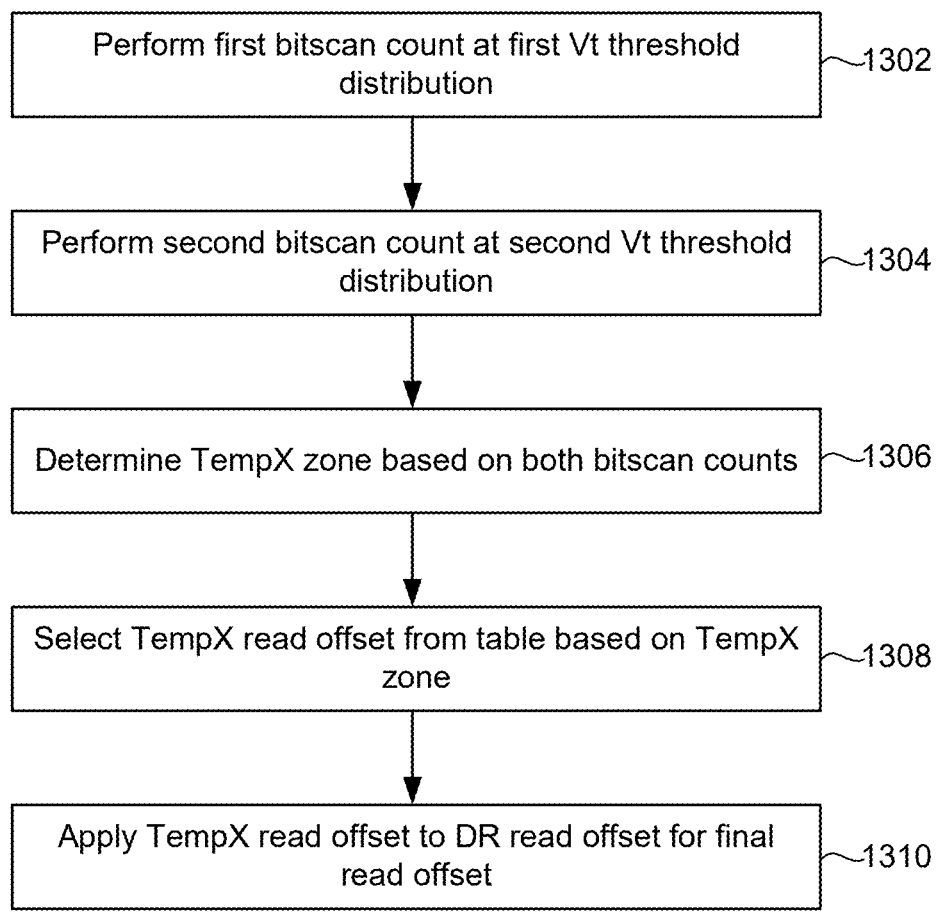
FIG. 13 is a flowchart of one embodiment of a process of dynamically updating read levels to compensate for both data retention and TempX.

FIG. 13 is a flowchart of one embodiment of a process 1300 of dynamically updating read levels to compensate for both data retention and TempX. The process 1300 may be used to read NAND memory cells such as, but not limited to, the example NAND memory architectures depicted in FIGS. 4-4E. Prior to 1300 the NAND memory cells are programmed to a number of data states. Process 1300 may be used to read MLC NAND. With reference to FIG. 6C, for example, each data state is associated with a Vt distribution. Process 1300 provides further details for an embodiment of process 700.

Step 1302 includes performing a bitscan at a first Vt distribution. For example, the memory system performs a bitscan to determine how many memory cells are in region 806 of Vt distribution 804. Step 1302 may be used to determine a shift to the first Vt distribution. In an embodiment, the first Vt distribution exhibits a greater Vt shift due to change in the temperature between programming and reading than due to change in the charge between programming and reading. In other words, the first Vt distribution exhibits a greater TempX effect than data retention effect. In an embodiment, the first Vt distribution is one of the lower Vt ranges. For example, with respect to FIG. 6C, the first Vt distribution might be any of S1, S2 S3, S4, or S5; however, this is for purpose of illustration.

Step 1304 includes performing a bitscan at a second Vt distribution. For example, the memory system performs a bitscan to determine how many memory cells are in region 816 of Vt distribution 812. Step 1004 may include determining a shift to the second Vt distribution. In an embodiment, the second Vt distribution exhibits a greater Vt shift due to change in the charge between programming and reading than due to change in the temperature between programming and reading. In other words, the second Vt distribution exhibits a greater a data retention effect than TempX effect. In an embodiment, the second Vt distribution is one of the higher Vt ranges. For example, with respect to FIG. 6C, the second Vt distribution might be any of S12, S13 S14, or S15; however, this is for purpose of illustration.

Step 1306 includes determining a TempX zone based on both bitscan counts. Step 1306 may be based on a graph such as depicted in FIG. 12A. Step 1306 may include determining whether the bitscan counts indicate that the TempX zone is above plot 1214, below plot 1216, or between plot 1214 and plot 1216. In one embodiment, the memory system will first insert the bitscan count for S_x into both equation 1 and 2 above, which yields two thresholds for S_y bit counts. The memory system then compares the S_y bitscan count with these two thresholds in order to determine the TempX zone. Therefore, the memory system in this manner determines whether the TempX zone is above plot 1214, below plot 1216, or between plot 1214 and plot 1216. However, another technique may be used to determine the TempX zone from the two bitscan counts.

Step 1308 includes selecting a TempX read offset from a table based on the TempX zone. For example, the memory system accesses the read offset from table 1250 (see FIG. 12B). Table 1250 contains read offsets that are state dependent.

Step 1310 includes applying the TempX read offset to a data retention read offset for a final read offset. The memory system may store a separate data retention read offset table. The memory system may use the bitscan count from S_x to access a data retention read offset from the retention read offset table. The memory system may add these two read level offsets and apply them to a default read level to determine the final read voltage.

Figure 14:
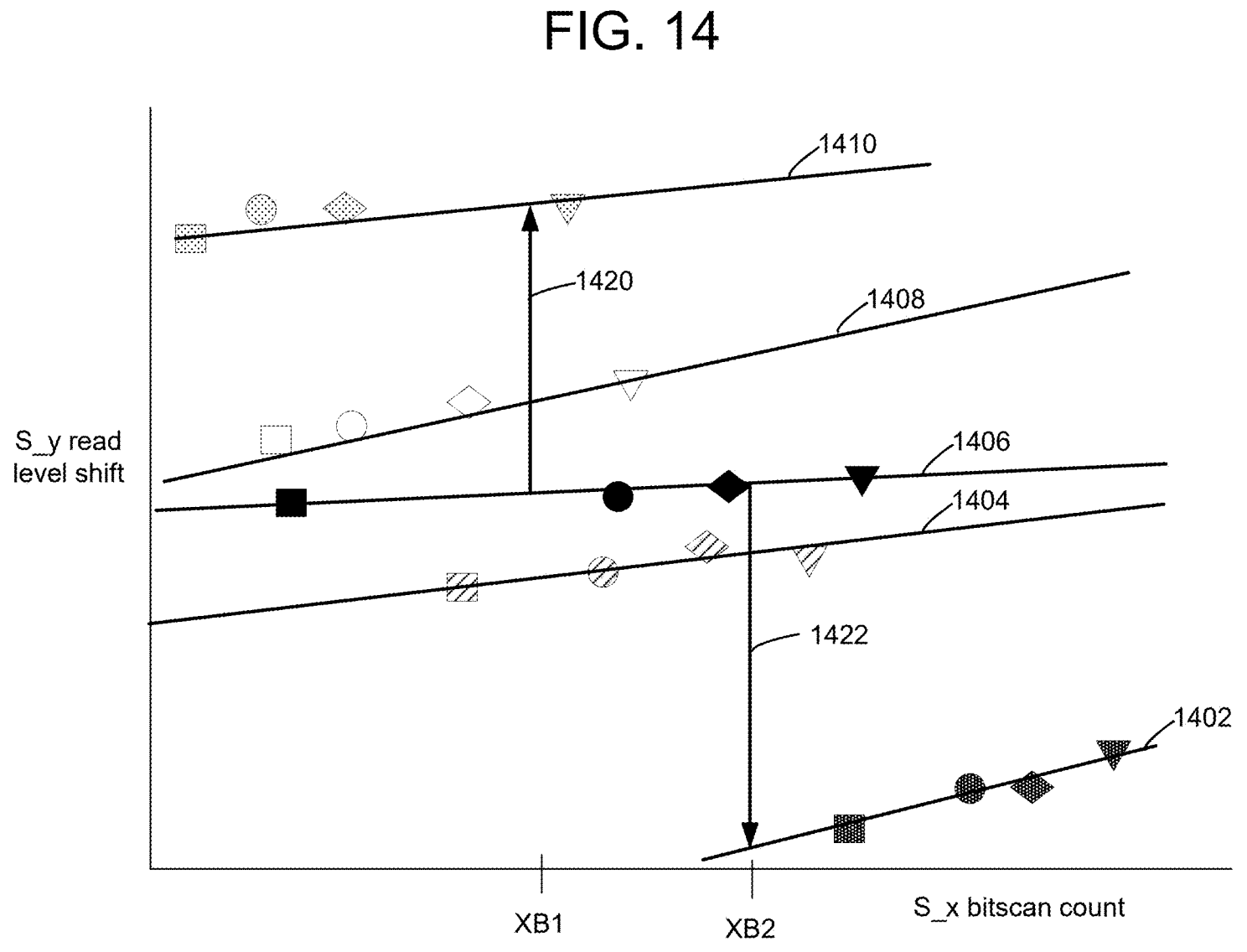

FIG. 14 shows S_x bitscan count versus S_y read level shift. The data points are for different TempX and different data retention times. Plot 1402 correlates the data points for a first TempX, plot 1404 correlates the data points for a second TempX, plot 1406 correlates the data points for a third TempX, plot 1408 correlates the data points for a fourth TempX, and plot 1410 correlates the data points for a fifth TempX. The first TempX may be −60 degrees Celsius, the second TempX may be −30 degrees Celsius, the third TempX may be 0 degrees Celsius, the fourth TempX may be +30 degrees Celsius, and the fifth TempX may be +60 degrees Celsius. Arrow 1420 shows a read level shift between plot 1406 and plot 1410 (for an S_x bitscan count of XB1). For the sake of example, arrow 1420 corresponds to a shift of +8 (DAC). The shift between plot 1406 and 1410 represents a +60 degrees Celsius TempX. Thus, if the TempX is determined to be +60 degrees Celsius (with S_x bitscan count of XB1), then a read level shift of +8 may be used. Arrow 1422 shows a read level shift between plot 1406 and plot 1402 (for an S_x bitscan count of XB2). For the sake of example, arrow 1422 corresponds to a shift of −8 (DAC). The shift between plot 1406 and 1402 represents a −60 degrees Celsius TempX. Thus, if the TempX is determined to be −60 degrees Celsius (with S_x bitscan count of XB2), then a read level shift of −8 may be used.

FIG. 15 is a table 1500 that may be used in combination with the technique described with respect to FIG. 14. The table 1500 contains offset information for four different TempX (−60 C, −30 C, +30 C, and +60 C). Each row of the table contains offset information for one or more states to be read. For example, the top row contains offset information for S1 (DVCG_S1R), the second row contains offset information for S2 and S3 (DVCG_S2S3R), etc. In general, each entry has a starting DAC and an ending DAC with a step size. The memory system may determine the TempX from the bitscan count for S_y. For example, the bitscan count for S_y may indicate a TempX of +60 degrees C. To obtain a read level offset for S2, the memory system accesses the entry for DVCG_S2S3R and 60C. This entry indicates a start DAC of 6 with a step size of 2. If, for example, the S_x bitscan count indicates a DR zone of 2 this indicates a DAC of 8 (6+2). This DAC of 8 may then be added to a base DR offset table to obtain the final read level offset for S2. This final read level offset for S2 is then applied to a default voltage for S2 in order to sense the memory cells.

Figure 16:
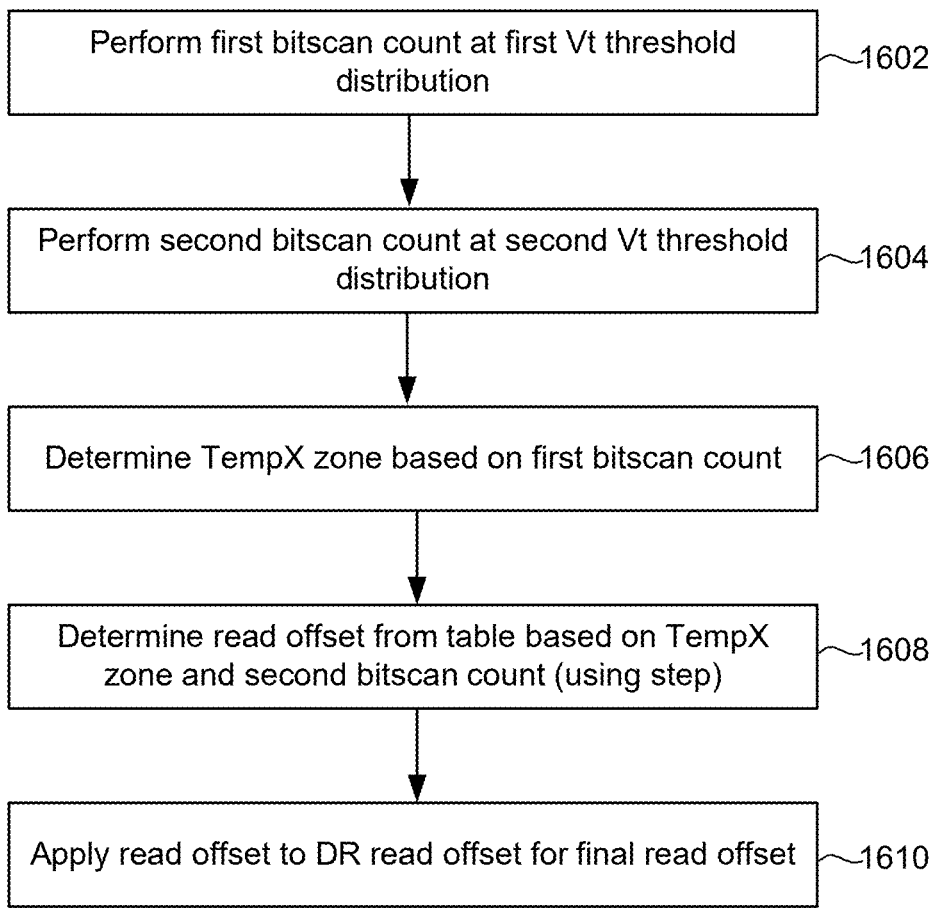
FIG. 16 is a flowchart of one embodiment of a process of dynamically updating read levels to compensate for both data retention and TempX.

FIG. 16 is a flowchart of one embodiment of a process 1600 of dynamically updating read levels to compensate for both data retention and TempX. The process 1600 may be used to read NAND memory cells such as, but not limited to, the example NAND memory architectures depicted in FIGS. 4-4E. Prior to 1600 the NAND memory cells are programmed to a number of data states. Process 1600 may be used to read MLC NAND. With reference to FIG. 6C, for example, each data state is associated with a Vt distribution. Process 1600 provides further details for an embodiment of process 700.

Step 1602 includes performing a bitscan at a first Vt distribution. For example, the memory system performs a bitscan to determine how many memory cells are in region

806 of Vt distribution 804. Step 1302 may be used to determine a shift to the first Vt distribution. In an embodiment, the first Vt distribution exhibits a greater Vt shift due to change in the temperature between programming and reading than due to change in the charge between programming and reading. In other words, the first Vt distribution exhibits a greater TempX effect than data retention effect. In an embodiment, the first Vt distribution is one of the lower Vt ranges. For example, with respect to FIG. 6C, the first Vt distribution might be any of S1, S2 S3, S4, or S5; however, this is for purpose of illustration.

Step 1604 includes performing a bitscan at a second Vt distribution. For example, the memory system performs a bitscan to determine how many memory cells are in region 816 of Vt distribution 812. Step 1004 may include determining a shift to the second Vt distribution. In an embodiment, the second Vt distribution exhibits a greater Vt shift due to change in the charge between programming and reading than due to change in the temperature between programming and reading. In other words, the second Vt distribution exhibits a greater a data retention effect than TempX effect. In an embodiment, the second Vt distribution is one of the higher Vt ranges. For example, with respect to FIG. 6C, the second Vt distribution might be any of S12, S13 S14, or S15; however, this is for purpose of illustration.

Step 1606 includes determining a TempX zone based on the first bitscan count. Step 1606 may be based on a graph such as depicted in FIG. 9A. Step 1606 may include determining whether the bitscan counts indicate that the TempX zone is closest the datapoints in oval 902, oval 904 or oval 906. For example, thresholds 910, 912 may be used to determine a TempX zone based on the first bitscan count. However, another technique may be used to determine the TempX zone from the first bitscan count.

Step 1608 includes selecting a read offset from a table based on the TempX zone and the second bitscan count. For example, the memory system accesses the read offset from table 1500 (see FIG. 15). The step size may be used to select a read offset. For example, the second bitscan count may be used to identify a DR zone, similar to the four DR zones in table 1150 in FIG. 11B. In one embodiment, the memory system applies one step for each DR zone.

Step 1610 includes applying the read offset to a data retention read offset for a final read offset. The memory system may store a separate data retention read offset table. The memory system may use the bitscan count from S_x to access a data retention read offset from the retention read offset table. The memory system may add these two read level offsets and apply them to a default read level to determine the final read voltage.

In view of the foregoing, an embodiment includes an apparatus comprising one or more control circuits configured to connect to a NAND memory structure. The NAND memory structure has NAND memory cells. The one or more control circuits are configured to program a group of the NAND memory cells to a plurality of data states including establishing a charge on each NAND memory cell. Each data state is associated with a threshold voltage distribution of a plurality of threshold voltage distributions. The one or more control circuits are configured to determine a first shift to a first threshold voltage distribution of the plurality of threshold voltage distributions and a second shift to a second threshold voltage distribution of the plurality of threshold voltage distributions. The first threshold voltage distribution exhibits a greater threshold voltage shift due to change in temperature between programming and sensing than due to change in the charge between programming and sensing.

The second threshold voltage distribution exhibits a greater threshold voltage shift due to change in the charge between programming and sensing than due to change in the temperature between programming and sensing. The one or more control circuits are configured to determine one or more read level offsets based on both the first shift and the second shift. The one or more control circuits are configured to sense the group of the NAND memory cells at a read reference voltage that is based on the one or more read level offsets.

In a further embodiment, the one or more control circuits are further configured to determine the first shift based on a first number of the memory cells in the group that have a threshold voltage between a first voltage and a second voltage associated with the first threshold voltage distribution. And the one or more control circuits are further configured to determine the second shift based on a second number of the memory cells in the group that have a threshold voltage between a third voltage and a fourth voltage associated with the second threshold voltage distribution.

In a further embodiment, the one or more control circuits are further configured to select a table based on the first shift. The table is one of a plurality of temperature based offset tables each having read level offsets. Each temperature based offset table for a different cross temperature between programming and sensing. The one or more control circuits are further configured to access an entry in the selected temperature based offset table based on the second shift to obtain a first read level offset of the one or more read level offsets.

In a further embodiment, the one or more control circuits are further configured to determine a cross-temperature based on both a first number of the memory cells in the group that have a threshold voltage between a first voltage and a second voltage associated with the first threshold voltage distribution and a second number of the memory cells in the group that have a threshold voltage between a third voltage and a fourth voltage associated with the second threshold voltage distribution. The one or more control circuits are further configured to determine a first read level offset of the one or more read level offsets based on the cross-temperature. The one or more control circuits are further configured to determine a second read level offset of the one or more read level offsets based on the second number of the memory cells.

In a further embodiment, the one or more control circuits are further configured to determine the cross-temperature based on a plurality of equations. Each equation is for a particular cross-temperature. Each equation having a y-intercept based on a first bitscan count of the first threshold voltage distribution when a second bitscan count of the second threshold voltage distribution is zero, and a slope that correlates a second bitscan count of the second threshold voltage distribution to the first bitscan count of the first threshold voltage distribution for the particular cross-temperature.

In a further embodiment, the one or more control circuits are further configured to access an entry in a cross-temperature table based on the cross-temperature to obtain a first read level offset of the one or more read level offsets. The one or more control circuits are further configured to determine a data retention factor based on the second number of the memory cells in the group that have a threshold voltage between the third voltage and the fourth voltage associated with the second threshold voltage distribution. The one or more control circuits are further configured to access an entry in a data retention table based on the data retention factor to obtain a obtain a second read level offset of the one or more read level offsets. And the one or more control circuits are further configured to add the first read level offset to the second read level offset to obtain a final read level offset for sensing the group.

In a further embodiment, the one or more control circuits are further configured to: access an entry in a table based on the first shift; obtain a first read level offset of the one or more read levels offset by applying a step to a base offset in the table, wherein a size of the step is based on the second shift. The one or more control circuits are further configured to obtain a second read level offset of the one or more read levels from a data retention based offset table based on the second shift and obtain the read reference voltage based on a combination of the first read level offset and the second read level offset.

In a further embodiment, the one or more control circuits are further configured to: access an entry in a cross-temperature table based on the first shift to obtain a first read level offset of the one or more read level offsets; access an entry in a data retention table based on the second shift to obtain a second read level offset of the one or more read level offsets; and determine the read reference voltage by applying first read level offset to the second read level offset.

An embodiment includes a method for reading memory cells. The method comprises programming NAND memory cells to a plurality of data states including establishing a charge on each NAND memory cell. Each data state is associated with a threshold voltage distribution of a plurality of threshold voltage distributions. The method comprises determining a cross-temperature factor based on sensing a group of the NAND memory cells at a first threshold voltage distribution of the plurality of threshold voltage distributions. The cross-temperature factor is related to a difference in temperature between programming the group and reading the group. The method comprises determining a data retention factor based on sensing the group of the NAND memory cells at a second threshold voltage distribution of the plurality of threshold voltage distributions. The data retention factor is related to a difference in the charge between programming the group and reading the group. The method comprises determining one or more read level offsets based on the cross-temperature factor and the data retention factor. The method comprises sensing the group of the NAND memory cells at a read reference voltage that is based on the one or more read level offsets.

An embodiment includes a non-volatile memory system, comprising a NAND memory structure having NAND memory cells and one or more control circuits configured to communicate with the NAND memory structure. The one or more control circuits are configured to program a group of the NAND memory cells to a plurality of data states including establishing a charge on each NAND memory cell. Each data state is associated with a threshold voltage distribution of a plurality of threshold voltage distributions. The one or more control circuits are configured to determine a first count of a first number of memory cells within a first threshold voltage range associated with a first threshold voltage distribution of the plurality of threshold voltage distributions. The first threshold voltage distribution exhibits a greater threshold voltage shift due to change in temperature between programming and reading than due to change in the charge between programming and reading. The one or more control circuits are configured to determine a second count of a second number of memory cells within a second threshold voltage range associated with a second threshold voltage distribution of the plurality of threshold voltage distributions. The second threshold voltage distribution exhibits a greater threshold voltage shift due to change in the charge between programming and reading than due to change in the temperature between programming and reading. The one or more control circuits are configured to determine one or more read level offsets based on the first count and the second count. The one or more control circuits are configured to sense the group of the NAND memory cells at a read reference voltage that is based on the one or more read level offsets.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   one or more control circuits configured to connect to a NAND memory structure, the NAND memory structure having NAND memory cells, the one or more control circuits configured to:
      program a group of the NAND memory cells to a plurality of data states including establishing first charges on corresponding NAND memory cells, each data state associated with a threshold voltage distribution of a plurality of threshold voltage distributions;
      determine a first shift to a first threshold voltage distribution of the plurality of threshold voltage distributions and a second shift to a second threshold voltage distribution of the plurality of threshold voltage distributions, the first threshold voltage distribution exhibits a greater threshold voltage shift due to change in temperature between programming and sensing than due to change in the first charges between programming and sensing, the second threshold voltage distribution exhibits a greater threshold voltage shift due to change in the first charges between programming and sensing than due to change in the temperature between programming and sensing, the first threshold voltage distribution has lower threshold voltages than the second threshold voltage distribution;
      determine one or more read level offsets based on both the first shift and the second shift; and
      sense the group of the NAND memory cells at a read reference voltage that is based on the one or more read level offsets.

2. The apparatus of claim 1, wherein the one or more control circuits are further configured to:
   determine the first shift based on a first number of the memory cells in the group that have corresponding first threshold voltages between a first voltage and a second voltage associated with the first threshold voltage distribution; and
   determine the second shift based on a second number of the memory cells in the group that have corresponding second threshold voltages between a third voltage and a fourth voltage associated with the second threshold voltage distribution.

3. The apparatus of claim 2, wherein the one or more control circuits are further configured to:
   select a table based on the first shift, the table is one of a plurality of temperature based offset tables each having read level offsets, each temperature based offset table for a different cross temperature between programming and sensing; and
   access an entry in the selected temperature based offset table based on the second shift to obtain a first read level offset of the one or more read level offsets.

4. The apparatus of claim 1, wherein the one or more control circuits are further configured to:
   determine a cross-temperature based on both a first number of the memory cells in the group that have corresponding first threshold voltages between a first voltage and a second voltage associated with the first threshold voltage distribution and a second number of the memory cells in the group that have corresponding second threshold voltages between a third voltage and a fourth voltage associated with the second threshold voltage distribution;
   determine a first read level offset of the one or more read level offsets based on the cross-temperature; and
   determine a second read level offset of the one or more read level offsets based on the second number of the memory cells.

5. The apparatus of claim 4, wherein the one or more control circuits are further configured to:
   determine the cross-temperature based on a plurality of equations, each equation for a particular cross-temperature, each equation having:
      a y-intercept based on a first bitscan count of the first threshold voltage distribution when a second bitscan count of the second threshold voltage distribution is zero; and
      a slope that correlates a second bitscan count of the second threshold voltage distribution to the first bitscan count of the first threshold voltage distribution for the particular cross-temperature.

6. The apparatus of claim 4, wherein the one or more control circuits are further configured to:

access an entry in a cross-temperature table based on the cross-temperature to obtain a first read level offset of the one or more read level offsets;

determine a data retention factor based on the second number of the memory cells in the group that have a threshold voltage between the third voltage and the fourth voltage associated with the second threshold voltage distribution;

access an entry in a data retention table based on the data retention factor to obtain a obtain a second read level offset of the one or more read level offsets; and add the first read level offset to the second read level offset to obtain a final read level offset for sensing the group.

7. The apparatus of claim 1, wherein the one or more control circuits are further configured to:

access an entry in a table based on the first shift;

obtain a first read level offset of the one or more read levels offset by applying a step to a base offset in the table, wherein a size of the step is based on the second shift;

obtain a second read level offset of the one or more read levels from a data retention based offset table based on the second shift; and obtain the read reference voltage based on a combination of the first read level offset and the second read level offset.

8. The apparatus of claim 1, wherein the one or more control circuits are further configured to:

access an entry in a cross-temperature table based on the first shift to obtain a first read level offset of the one or more read level offsets;

access an entry in a data retention table based on the second shift to obtain a second read level offset of the one or more read level offsets; and determine the read reference voltage by applying first read level offset to the second read level offset.

9. A non-volatile memory system, comprising:

a NAND memory structure having NAND memory cells; and one or more control circuits configured to communicate with the NAND memory structure, the one or more control circuits configured to:

program a group of the NAND memory cells to a plurality of data states including establishing first charges on corresponding NAND memory cell, each data state associated with a threshold voltage distribution of a plurality of threshold voltage distributions;

determine a first count of a first number of memory cells within a first threshold voltage range associated with a first threshold voltage distribution of the plurality of threshold voltage distributions, the first threshold voltage distribution exhibits a greater threshold voltage shift due to change in temperature between programming and reading than due to change in the first charges between programming and reading, the first count within the first threshold voltage range indicates an upshift of the first threshold voltage distribution;

determine a second count of a second number of memory cells within a second threshold voltage range associated with a second threshold voltage distribution of the plurality of threshold voltage distributions, the second threshold voltage distribution exhibits a greater threshold voltage shift due to change in the first charges between programming and reading than due to change in the temperature between programming and reading, the second count within the second threshold voltage range indicates a downshift of the second threshold voltage distribution;

determine one or more read level offsets based on the first count and the second count; and sense the group of the NAND memory cells at a read reference voltage that is based on the one or more read level offsets.

10. The non-volatile memory system of claim 9, wherein the one or more control circuits are further configured to:

select a table based on the first count, the table is one of a plurality of temperature based tables each having read level offsets; and access an entry in the selected table based on the second count to obtain a first read level offset of the one or more read level offsets.

11. The non-volatile memory system of claim 10, wherein the one or more control circuits are further configured to:

access an entry in a data retention based offset table using the second count to obtain a second read level offset of the one or more read level offsets; and add the first read level offset and the second read level offset.

12. The non-volatile memory system of claim 9, wherein the one or more control circuits are further configured to:

select a row in a table based on both the first count and the second count; and access an entry in the row to obtain a first read level offset of the one or more read level offsets.

13. The non-volatile memory system of claim 12, wherein the one or more control circuits are further configured to:

access an entry in a data retention based offset table using the second count to obtain a second read level offset of the one or more read level offsets; and add the first read level offset and the second read level offset.

14. The non-volatile memory system of claim 9, wherein the one or more control circuits are further configured to:

select an entry in a table based on the first count to obtain a first read level offset of the one or more read level offsets;

determine a second read level offset of the one or more read level offsets by applying a number of step sizes based on the second count; and add the first read level offset and the second read level offset.

15. A method for reading memory cells, the method comprising:

programming a group of NAND memory cells in a NAND memory structure to a plurality of data states, including establishing first charges on corresponding NAND memory cell, wherein each data state associated with a threshold voltage distribution of a plurality of threshold voltage distributions;

determining a first shift to a first threshold voltage distribution of the plurality of threshold voltage distributions and a second shift to a second threshold voltage distribution of the plurality of threshold voltage distributions, the first threshold voltage distribution exhibits a greater threshold voltage shift due to change in temperature between programming and sensing than due to change in the first charges between programming and sensing, the second threshold voltage distribution exhibits a greater threshold voltage shift due to change in the first charges between programming and sensing than due to change in the temperature between programming and sensing, the first threshold voltage distribution has lower threshold voltages than the second threshold voltage distribution;

determining one or more read level offsets based on both the first shift and the second shift; and sensing the group of the NAND memory cells at a read reference voltage that is based on the one or more read level offsets.

\*    \*    \*    \*    \*